United States Patent
Matsuoka et al.

(10) Patent No.: US 7,910,979 B2
(45) Date of Patent: Mar. 22, 2011

(54) NONVOLATILE SEMICONDUCTOR MEMORY DEVICE

(75) Inventors: Yasuyuki Matsuoka, Yokohama (JP); Yoshiaki Fukuzumi, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 428 days.

(21) Appl. No.: 12/169,371

(22) Filed: Jul. 8, 2008

(65) Prior Publication Data
US 2010/0006922 A1 Jan. 14, 2010

(51) Int. Cl.
*H01L 29/792* (2006.01)
(52) U.S. Cl. ........................................ 257/324; 257/316
(58) Field of Classification Search .................. 257/316, 257/324
See application file for complete search history.

(56) References Cited

U.S. PATENT DOCUMENTS

2005/0063237 A1* 3/2005 Masuoka et al. .............. 365/222
2007/0252201 A1 11/2007 Kito et al.

OTHER PUBLICATIONS

U.S. Appl. No. 12/013,672, filed Jan. 14, 2008, Yoshiaki Fukuzumi, et al.

* cited by examiner

*Primary Examiner* — Thao X Le
*Assistant Examiner* — Tanika Warrior
(74) *Attorney, Agent, or Firm* — Oblon, Spivak, McClelland, Maier & Neustadt, L.L.P.

(57) ABSTRACT

The invention provides a nonvolatile semiconductor memory device comprising a plurality of memory strings each including a plurality of electrically programmable memory cells connected in series. The memory string includes a semiconductor pillar, an insulator formed around the circumference of the semiconductor pillar, and first through nth electrodes to be turned into gate electrodes (n denotes a natural number equal to 2 or more) formed around the circumference of the insulator. It also includes interlayer electrodes formed in regions between the first through nth electrodes around the circumference of the insulator.

18 Claims, 35 Drawing Sheets

FIG. 10

|     | Read  | Write「0」 | Write「1」 | Erase (Selected) | Erase (Selected) |
| --- | ----- | --------- | --------- | ---------------- | ---------------- |
| BL  | Vbl   | 0         | Vdd       | Verase           | Verase           |
| SGD | Vdd   | Vdd       | Vdd       | Vg_era del       | Vg_era del       |
| WL4 | Vread | Vpass     | Vpass     | 0                | Open             |
| WL3 | 0     | Vprog     | Vprog     | 0                | Open             |
| WL2 | Vread | Vpass     | Vpass     | 0                | Open             |
| WL1 | Vread | Vpass     | Vpass     | 0                | Open             |
| SGS | Vdd   | Voff      | Voff      | Vg_era del       | Vg_era del       |
| SL  | 0     | Vdd       | Vdd       | Open             | Open             |
| PW  | 0     | 0         | 0         | Verase           | Verase           |

NONVOLATILE SEMICONDUCTOR MEMORY DEVICE

BACKGROUND OF THE INVENTION

1. Field of the Invention

The present invention relates to an electrically programmable nonvolatile semiconductor memory device, and more particularly to a nonvolatile semiconductor memory device packaged at high density.

2. Description of the Related Art

A surge in the need for small-sized, large-capacity nonvolatile semiconductor memory devices causes attention to be focused on NAND-type flash memories, which are expectable to achieve high integration and mass storage.

Proceeding high integration and mass storage associated with the NAND-type flash memory requires a reduction in design rule. The reduction in design rule requires finer pattering of wiring patterns and so forth. Realizing finer pattering of wiring patterns and so forth requires extremely sophisticated processing technologies and makes it difficult to achieve the reduction in design rule.

In recent years, a number of semiconductor memory devices including memory cells arranged in three dimensions have been proposed to increase the degree of integration. (See JP 2003-078044A, and Masuoka et al., "Novel Ultrahigh-Density Flash Memory With a Stacked-Surrounding Gate Transistor (S-SGT) Structured Cell", IEEE TRANSACTIONS ON ELECTRON DEVICES, VOL. 50, NO. 4, pp. 945-951, April 2003).

Many of the semiconductor memory devices of prior art including memory cells arranged in three dimensions require plural photo-etching processes (hereinafter referred to as "PEP": Processes for patterning with the use of the so-called lithography step using photoresist and the steps of processing such as etching) per layer in the memory cell portion. A photo-etching process with the minimum line width in the design rule is herein referred to as a "critical PEP". A photo-etching process with a larger line width than the minimum line width in the design rule is herein referred to as a "rough PEP". The semiconductor memory device of conventional art including memory cells arranged in three dimensions requires three or more critical PEPs per layer in the memory cell portion. Many of the semiconductor memory devices of conventional art comprise simply stacked memory cells, which inevitably increase the cost on achievement of the three-dimensionality.

One of the semiconductor memory devices of conventional art including memory cells arranged in three dimensions is a semiconductor memory device including cylinder-structured transistors (SGT: Surrounding Gate Transistor) (JP 2003-078044A). The semiconductor memory device including the cylinder-structured transistors (SGT) is produced through processes of forming channel (body) portions in stacked memory transistors in the shape of pillars, and then forming on sides a film of polysilicon to be turned into gate electrodes. Therefore, the structure seen from right above is a skewered structure.

In the semiconductor memory device thus structured, if an ON-state achievable electric field is applied to gate electrodes, each of the gate electrodes causes a variation in channel to be formed. Therefore, variations in resistance arise, leaving insufficient controllability and stability. In addition, a channel formed in a semiconductor region tends to have a higher resistance.

Further, a narrowed interval between the gate electrodes for the purpose of high integration increases the capacity between the gate electrodes and may increase the disturbance failure possibly.

SUMMARY OF THE INVENTION

In an aspect the present invention provides a nonvolatile semiconductor memory device comprising a plurality of memory strings each including a plurality of electrically programmable memory cells connected in series, the memory string including a semiconductor pillar, an insulator formed around the circumference of the semiconductor pillar, and first through nth electrodes to be turned into gate electrodes (n denotes a natural number equal to 2 or more) formed around the circumference with the insulator interposed, also including interlayer electrodes formed in regions between the first through nth electrodes around the circumference with the insulator interposed.

BRIEF DESCRIPTION OF THE DRAWINGS

FIG. 10 is a relational diagram of biases in the operations in FIGS. 6-9.

DETAILED DESCRIPTION OF THE EMBODIMENTS

First Embodiment

One embodiment of the present invention will now be described below.

Figure 1:
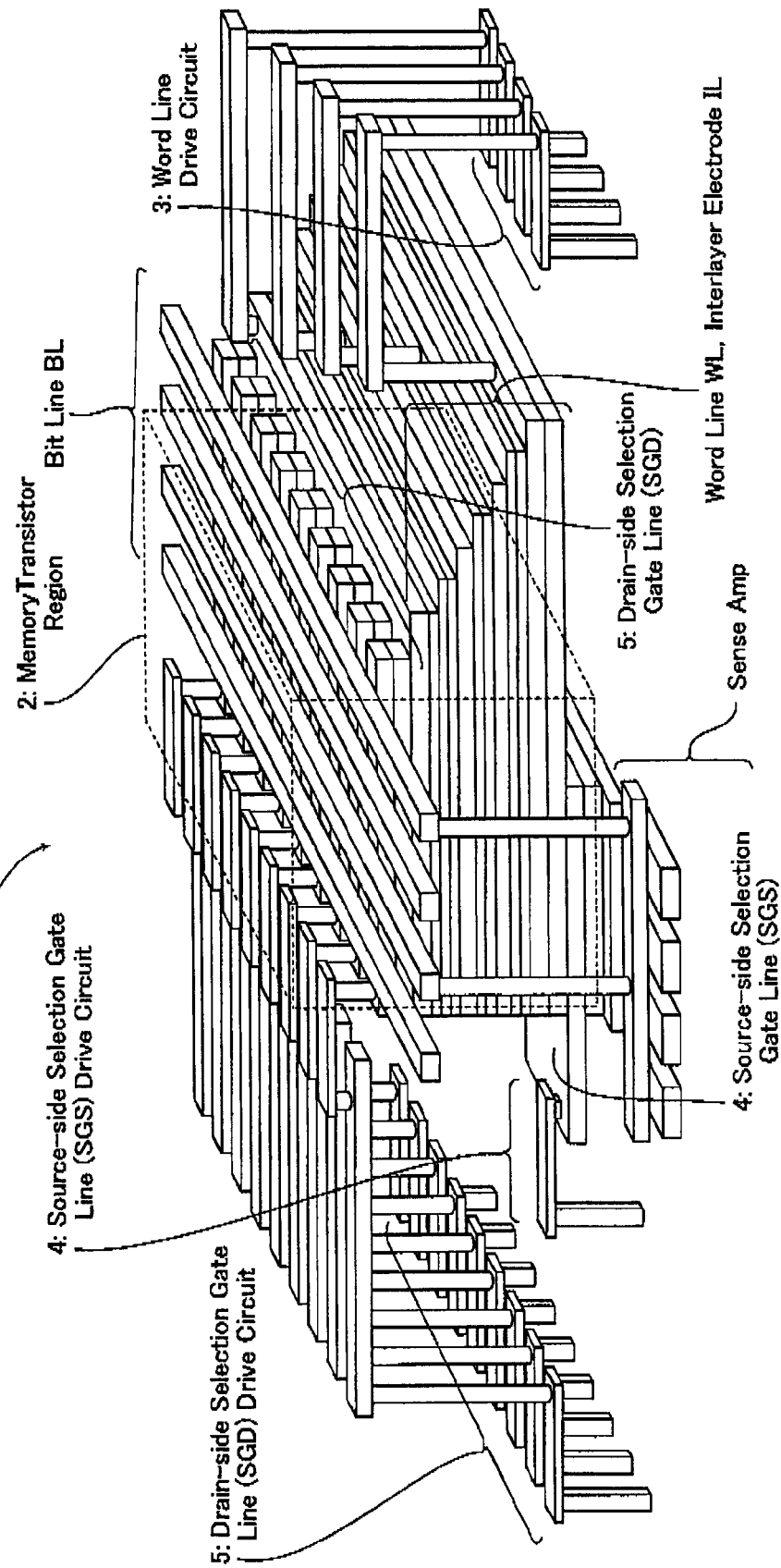
FIG. 1 is a brief block diagram of an SGT-structured nonvolatile semiconductor memory device.

FIG. 1 shows a brief block diagram of a nonvolatile semiconductor memory device 1 according to the present embodiment. The nonvolatile semiconductor memory device 1 according to the present embodiment comprises a memory transistor region 2, a word line drive circuit 3, a source-side selection gate line (SGS) drive circuit 4, a drain-side selection gate line (SGD) drive circuit 5, a sense amp 6 and so forth. As shown in FIG. 1, in the nonvolatile semiconductor memory device 1 according to the present embodiment, memory transistors contained in the memory transistor region 2 are formed with a plurality of semiconductor layers stacked. A word line WL in each layer expands in two dimensions as shown in FIG. 1. The word line WL in each layer has a flat structure in a respective identical layer, which is a plate-shaped flat structure. There are interlayer electrodes IL each formed between the word lines WL with insulators interposed.

In the nonvolatile semiconductor memory device 1 according to the present embodiment shown in FIG. 1, a source-side selection gate line (SGS) has a plate-shaped flat wiring structure while drain-side selection gate lines (SGD) have respective isolated wiring structures.

Figure 2:
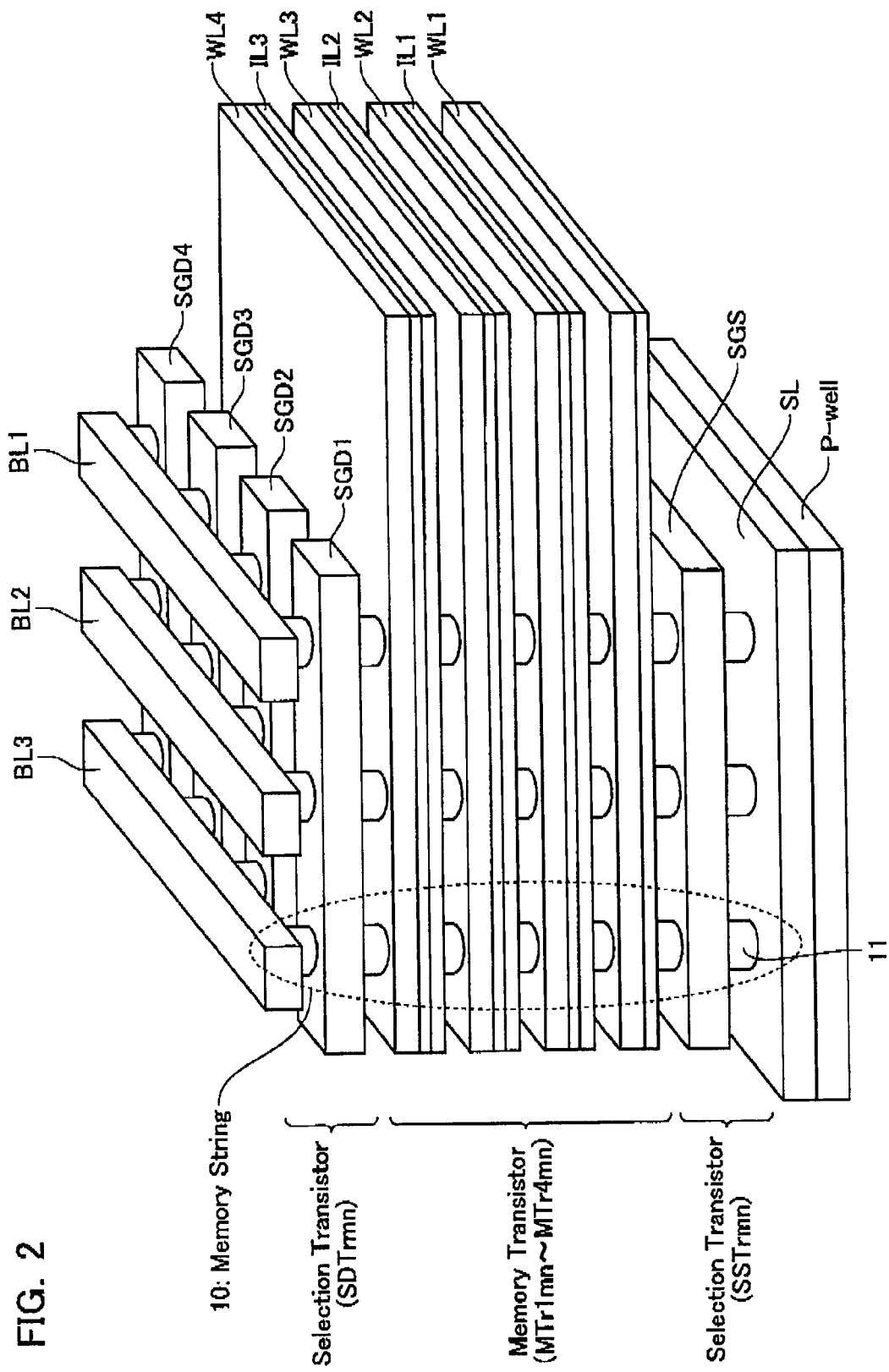
FIG. 2 is a brief block diagram of a memory transistor region in the SGT-structured nonvolatile semiconductor memory device.

FIG. 2 shows a brief block diagram of part of the memory transistor region 2 in the nonvolatile semiconductor memory device 1 according to the present embodiment. In the present embodiment, the memory transistor region 2 comprises m×n memory trains or memory strings 10 including memory transistors (MTr1$mn$-MTr4$mn$), and selection transistors SSTrmn and SDTrmn (m and n denote natural numbers). FIG. 2 shows an example when m=3 and n=4.

The memory transistors (MTr1$mn$-MTr4$mn$) in the memory strings 10 have respective gates connected to word lines (WL1-WL4), which are each formed of an identical conductive layer, and are common among the memory strings. Namely, the gates of the memory transistors MTr1$mn$ in the memory strings 10 are all connected to the word line WL1. The gates of the memory transistors MTr2$mn$ in the memory strings 10 are all connected to the word line WL2. The gates of the memory transistors MTr3$mn$ in the memory strings 10 are all connected to the word line WL3. The gates of the memory transistors MTr4$mn$ in the memory strings 10 are all connected to the word line WL4. In the nonvolatile semiconductor memory device 1 according to the present embodiment, as shown in FIGS. 1 and 2, the word lines (WL1-WL4) expand in two dimensions and have a plate-shaped flat structure, respectively. The word lines (WL1-WL4) have a flat structure almost normal to the memory strings 10. The source-side selection gate line SGS for driving the source-side selection transistors SSTrmn can be kept always at a common potential, on operation, over the memory strings. Accordingly, in the present embodiment, the source-side selection gate line SGS has the plate-shaped structure.

There are interlayer electrodes IL1-3 provided between the word lines WL1-4 with insulators interposed (not shown in FIG. 2). The interlayer electrodes IL1-3 have a plate-shaped flat structure expanding in two dimensions as well as the word lines WL.

Each of the memory strings 10 has a semiconductor pillar 11 on an N$^+$-type region formed in a P-well region on a semiconductor substrate. The memory strings 10 are arranged in matrix within a plane normal to the semiconductor pillar 11. The semiconductor pillar 11 may be shaped in a cylinder or a prism. The semiconductor pillar may include a semiconductor pillar having a stepped shape.

The word lines WL may have an extent at least twice the distance equal to the interval between adjacent semiconductor pillars plus the diameter of a semiconductor pillar. In other words, preferably, the word lines WL have an extent at least twice the distance between the centers of adjacent semiconductor pillars.

Figure 3B:
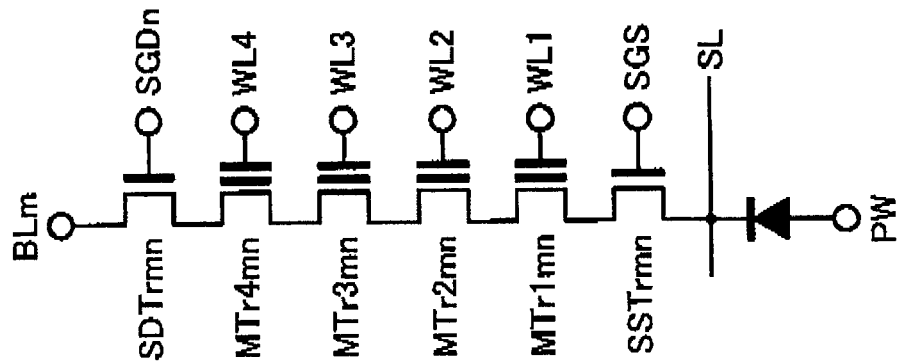
FIG. 3 is a brief block diagram of a memory string in the SGT-structured nonvolatile semiconductor memory device.
Figure 3A:
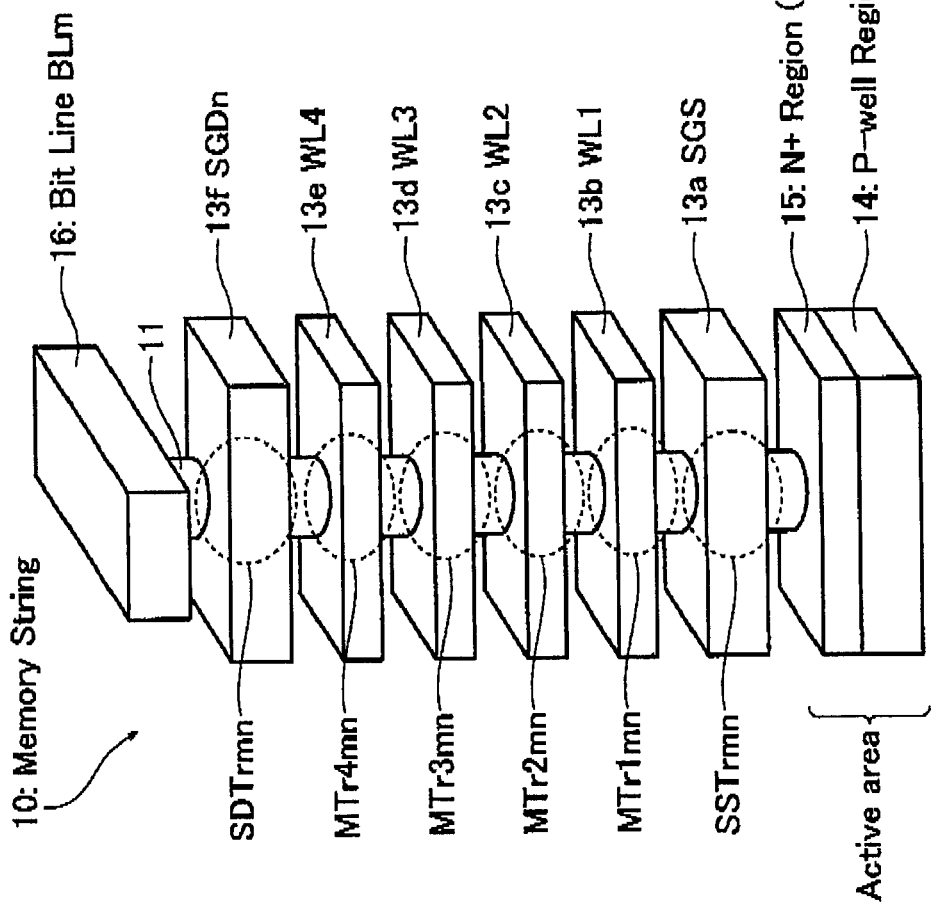

FIG. 3A shows a brief structure of one memory string 10 (mn-th memory string in this example) in the nonvolatile semiconductor memory device 1 according to the present embodiment, and FIG. 3B shows an equivalent circuit diagram thereof. FIG. 3A omits the depiction of the interlayer electrodes IL1-3. In the present embodiment, the memory string 10 includes four memory transistors MTr1$mn$-MTr4$mn$ and two selection transistors SSTrmn and SDTrmn. These four memory transistors MTr1mn-MTr4mn and two selection transistors SSTrmn and SDTrmn are connected in series as shown in FIG. 3. In one memory string 10 in the nonvolatile semiconductor memory device 1 according to the present embodiment, a semiconductor pillar 11 is formed on an $N^+$-type region 15 formed in a P-type region (P-well region) 14 on a semiconductor substrate. There is an insulator 12 formed around the semiconductor pillar 11, and a plurality of plate-shaped electrodes 13a-13f formed around the insulator 12. The electrodes 13b-13e, the insulator 12 and the semiconductor pillar 11 form the memory transistors MTr1mn-MTr4mn. The insulator 12 is an insulator serving as a charge storage layer (such as a stacked film of silicon oxide, silicon nitride and silicon oxide). If the insulator 12 is the stacked film of silicon oxide, silicon nitride and silicon oxide, so-called ONO film, then charge is held in traps discretely distributed in the silicon nitride. The electrodes 13b-13e are turned into the word lines WL1-WL4, and 13f and 13a into the selection gate lines SGDn and SGS. The selection transistor SDTrmn has one source/drain end connected to a bit line BLm. The selection transistor SSTrmn has one source/drain end connected to a source line SL (the $N^+$-type region 15 in the present embodiment). The above charge storage layer may be formed around the semiconductor pillar 11 for the memory transistors MTr1mn-MTr4mn (such that it locates between the semiconductor pillar 11 and the electrodes 13b-13e).

The charge storage layer may contain a floating gate formed of a conductor. In this case, the conductor is formed only between the semiconductor pillar and the word lines. The insulator 12 is formed between the electrodes 13a and 13f and the semiconductor pillar 11 to serve as a gate insulator.

The memory string 10 has four memory transistors MTr1mn-MTr4mn in the present embodiment though the number of memory transistors contained in one memory string is not limited to this but rather can be varied to any appropriate number in accordance with the memory capacity.

The memory string in the present embodiment has a generally symmetrical shape about the central axis of the semiconductor pillar.

Figure 4:
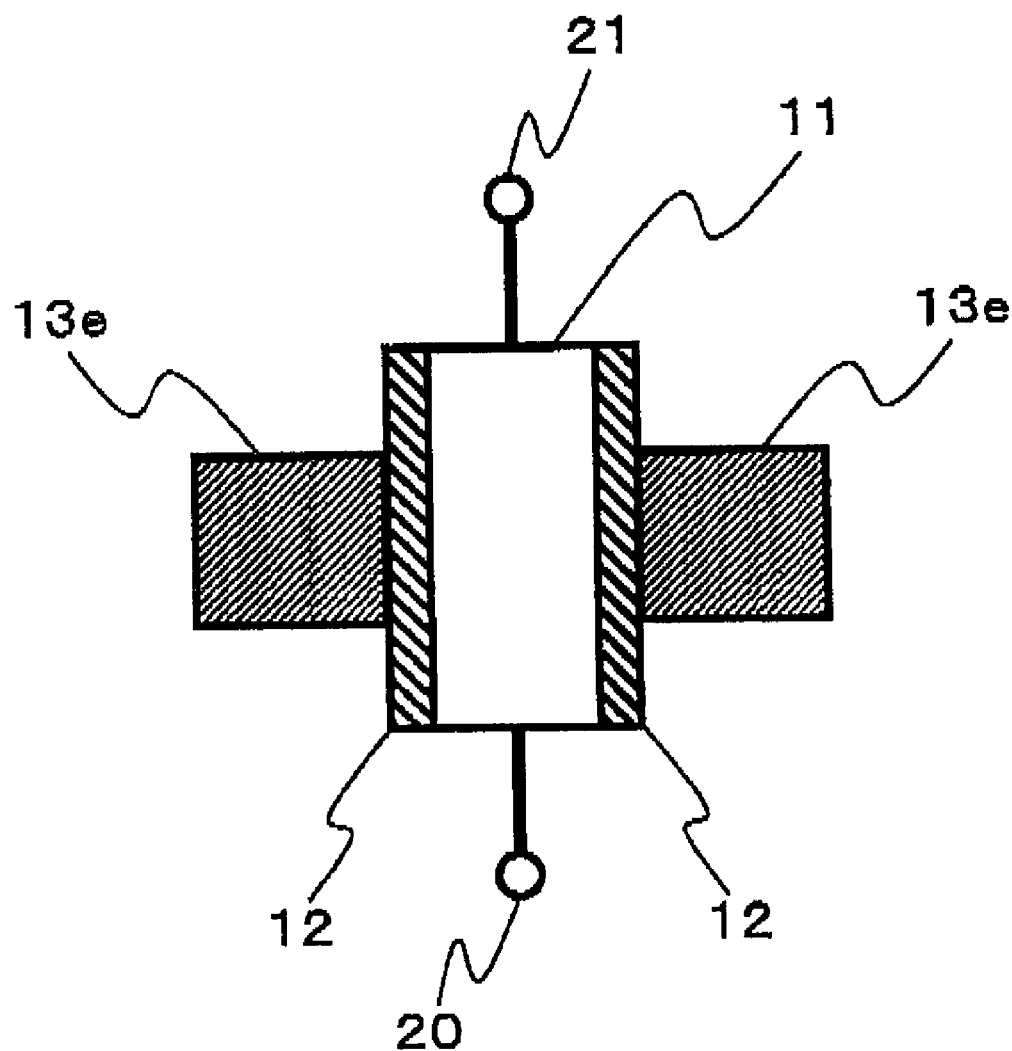
FIG. 4 is a brief block diagram of a memory transistor MTr in the SGT-structured nonvolatile semiconductor memory device.

FIG. 4 shows a cross-sectional structural view of one memory transistor MTr (e.g. MTr4mn) in the present embodiment, Other memory transistors MTr1mn-MTr3mn have the similar configuration to the memory transistor MTr4mn. The memory transistor MTr4mn includes the conductor layer 13e, which surrounds the semiconductor pillar 11 with the insulator 12 interposed and serves as a control gate electrode. The memory transistor MTr4mn has a source 20 and a drain 21, which are formed in the semiconductor pillar 11. If the memory transistor MTr1mn and the selection gate transistors SSTrmn and SDTrmn have a depletion-type transistor structure, the semiconductor portion 11 may have no definite source/drain diffused layer. It may be an enhancement-type transistor in which a region of the semiconductor pillar 11 generally surrounded by the conductor layer 13e is a P-type semiconductor region while a region of the semiconductor pillar 11 not surrounded by the conductor layer 13e is an N-type semiconductor region.

One memory string 10 is described in FIGS. 3 and 4 though all the memory strings in the nonvolatile semiconductor memory device 1 according to the present embodiment have the similar configuration.

[Operations]

The following description is given first to "reading", "programming" and "erasing" in the memory transistors MTr1mn-MTr4mn in one memory string 10 according to the present embodiment on the basis of FIGS. 3A and 3B. In this case, "reading" and "programming" are described by way of the memory transistor MTr3mn.

The memory transistors MTr1mn-MTr4mn in the present embodiment are vertical transistors of the so-called MONOS type that comprises a semiconductor portion 11, an insulator serving as a charge storage layer (a stacked film of silicon oxide, silicon nitride and silicon oxide), and a conductor layer (a polysilicon layer in the present embodiment). In the following description, the memory transistor MTr is assumed to have a threshold Vth of around 0 V when no electron is stored in the charge storage layer (hereinafter referred to as a "neutral threshold").

[Reading]

On reading data from the memory transistor MTr3mn, a voltage Vb1 (e.g. 0.7 V) is applied to a bit line BLm; 0 V to the source line SL; Vdd (e.g. 3.0 V) to the selection gate lines SGD and SGS; and VPW (e.g. 0 V) to the P-Well region. The word line WL3 connected to the read-target bit (MTr3mn) is set at 0V and other word lines WL at Vread (e.g. 4.5V). Thus, depending on whether the threshold Vth of the read-target bit (MTr3mn) is higher than 0 V, the current flowing in the bit line BLm can be determined. Accordingly, sensing the current flowing in the bit line BLm makes it possible to read data information from the bit (MTr3mn). The similar operation can be used to read data from other bits (memory transistors MTr1mn, MTr2mn, MTr4mn)

[Programming]

On programming data "0" in the memory transistor MTr3mn, electrons are injected into the charge storage layer in the memory transistor MTr3mn to elevate the threshold of the memory transistor (shift the threshold positively). In this case, 0 V is applied to the bit line BLm; Vdd to the source line SL; Vdd (e.g. 3.0V) to the selection gate line SGDn; Voff (e.g. 0 V) to the selection gate line SGS; and VPW (e.g. 0 V) to the P-Well region. In addition, Vprog (e.g. 18 V) is applied to the word line WL3 associated with the program-target bit (MTr3); and Vpass (e.g. 10V) to other word lines. As a result, only the desired bit (MTr3mn) has an enhanced strength of the electric field placed across the charge storage layer. Thus, electrons can be injected into the charge storage layer to positively shift the threshold of the memory transistor MTr3mn.

On programming data "1" in the memory transistor MTr3mn, the threshold of the memory transistor MTr3mn is not elevated from the erased state (to inject no electron into the charge storage layer). In this case, application of Vdd to the bit line BLm makes the potential on the gate of the selection transistor SDTrmn equal to the potential on the source thereof. Therefore, the selection transistor SDTrmn is turned off to reduce the potential difference between the channel region (body) in the memory transistor MTr3mn and the word line WL3. Accordingly, no injection of electrons into the charge storage layer arises in the memory transistor MTr3mn. The similar operation can be used to program data in other bits (memory transistors MTr1mn, MTr2mn, MTr4mn).

[Erasing]

On erasing data, in a block of plural memory strings 10, data is erased from the memory transistors MTr1mn-MTr4mn.

In a selected block (erase-target block), Verase (e.g. 20 V) is applied to the P-well region, and the source line SL is floated. In addition, the potentials on the selection gate lines SGS and SGDn are elevated (e.g. 15 V) with a slight time shift (e.g. around 4 μs) from the timing of application of Verase to the P-well region. As a result, GIDL (Gate Induced Drain Leak) current arises in the vicinity of the gate end of the selection transistor SSTrmn. In this case, the resultant holes flow in the semiconductor layer 11 or the body of the memory transistors MTr1*mn*-MTr4*mn* while electrons flow toward the P-well region. Thus, a potential near Verase is transferred to the channel region (body) in the memory transistor MTr. Accordingly, if the word lines WL1-WL4 are set at 0 V, electrons in the charge storage layers in the memory transistors MTr1*mn*-MTr4*mn* are drawn to the P-well region to erase data from the memory transistors MTr1*mn*-MTr4*mn*.

On erasing data from the memory transistors in a selected block, the word lines WL1-WL4 are floated in non-selected blocks. As a result, in accordance with the elevation of the potentials on the channel region (body) in the memory transistors MTr1*mn*-MTr4*mn*, the potentials on the word lines WL1-WL4 rise by coupling. In this case, no potential difference arises between the word lines WL1-WL4 and the charge storage layer in the memory transistors MTr1*mn*-MTr4*mn* and accordingly electrons are not drawn (erased) from the charge storage layer.

Figure 5:
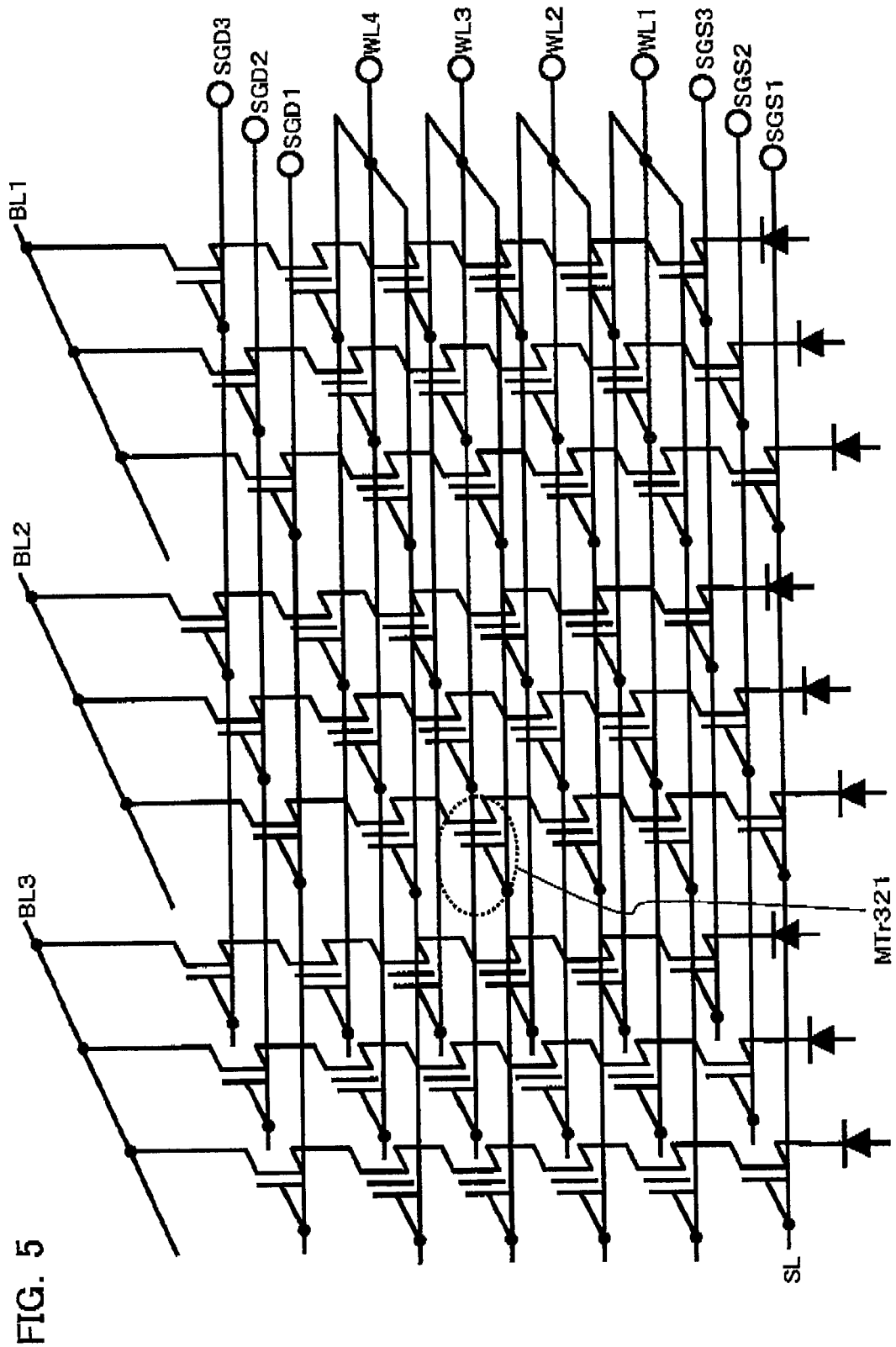
FIG. 5 is an equivalent circuit diagram of the nonvolatile semiconductor memory device shown in FIG. 1.

The following description is given next to "reading", "programming" and "erasing" in the nonvolatile semiconductor memory device 1 according to the present embodiment including the memory strings 10 arranged two-dimensionally in length and width on the substrate surface. FIG. 5 shows an equivalent circuit diagram of the nonvolatile semiconductor memory device 1 according to the present embodiment. In the nonvolatile semiconductor memory device 1 according to the present embodiment, the potentials on the word lines. WL1-WL4 are at equipotential, respectively, as described above. The selection gate lines SGS1-SGS3 can be controlled individually in this example. Though, the selection gate lines SGS1-SGS3 may be formed in the same conductor layer at equipotential to control the potentials thereon.

In a memory transistor MTr321 (MTr3 in a memory string connected to a bit line BL2 and selection gate lines SGS1 and SGD1) shown with the dotted line, "reading" and "programming" are described. In addition, "erasing" in memory transistors is also described.

[Reading]

Figure 6:
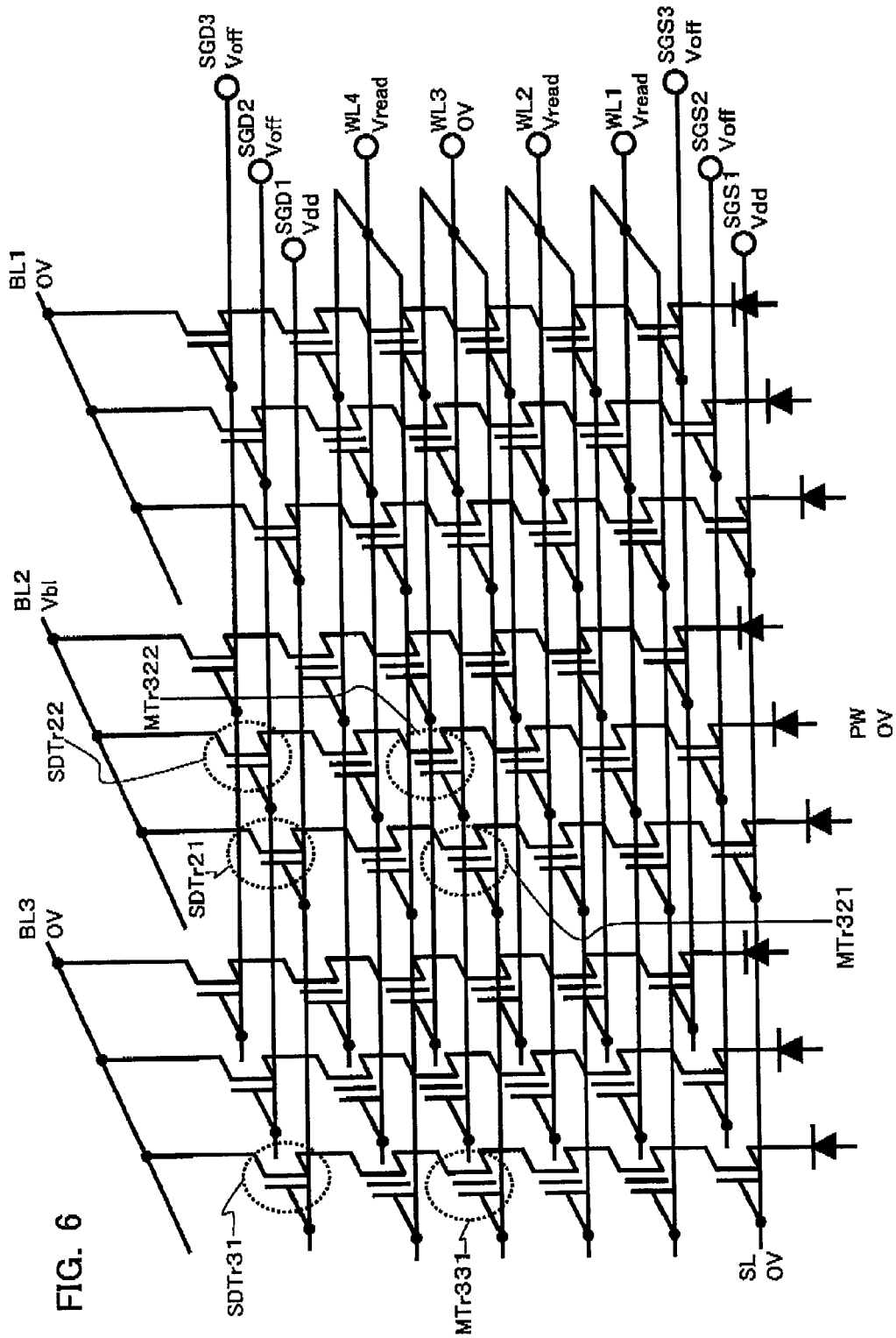
FIG. 6 is a phase diagram on reading in the nonvolatile semiconductor memory device.

FIG. 6 shows a phase diagram of biases on reading data from the memory transistor MTr321 shown with the dotted line in the nonvolatile semiconductor memory device 1 according to the present embodiment. The memory transistor MTr also in the present embodiment is a vertical transistor of the so-called MONOS type that comprises a semiconductor portion 11, an insulator serving as a charge storage layer (a stacked film of silicon oxide, silicon nitride and silicon oxide), and a conductor layer (a polysilicon layer in the present embodiment). In the following description, the memory transistor MTr is assumed to have a threshold Vth of around 0 V when no electron is stored in the charge storage layer (hereinafter referred to as a "neutral threshold").

On reading data from the memory transistor MTr321, a voltage Vb1 (e.g. 0.7 V) is applied to the bit line BL2 connected to the memory transistor MTr321; 0 V to other bit lines BL; 0 V to the source line SL; Vdd (e.g. 3.0 V) to the selection gate lines SGD1 and SGS1 connected to the memory transistor MTr321; Voff to other selection gate lines SGD and SGS; and VPW (e.g. 0 V) to the P-well region (PW) (VPW may be any potential unless the P-well region and the memory string are forward-biased). The word line WL3 connected to the read-target bit (MTr321) is set at 0 V and other word lines WL at Vread (e.g. 4.5 V). As a result, a potential difference arises between the bit line BL2 associated with the read-target bit (MTr321) and the source line SL, and the selection gate line SGD1 is turned on. Therefore, depending on whether the threshold Vth of the read-target bit (MTr321) is higher than 0 V, the current flowing in the bit line BL2 can be determined. Accordingly, sensing the current flowing in the bit line BL2 makes it possible to read data information from the bit (MTr321). The similar operation can be used to read data from other bits (memory transistors MTr1*mn*). In this case, even if the memory transistor MTr322 has a threshold Vth of any value, that is, either "1" or "0" is programmed in the memory transistor MTr322, the selection gate line SGD2 is kept at Voff. Therefore, no current can flow in the memory transistor MTr322 and the MTr322-belonging memory string 10. This is similar to all memory strings 10 that are connected to the bit line BL2 but not connected to the selection gate line SGD1.

The following description is made by way of the memory transistor MTr331. In the case of the MTr331-belonging memory string 10, even if the memory transistor MTr331 has a threshold Vth of any value, that is, either "1" or "0" is programmed therein, the bit line BL3 is at 0 V and equipotential to the source line SL. Therefore, no current can flow in the bit line BL3. This is similar to all memory strings 10 that are not connected to the bit line BL2.

Thus, the nonvolatile semiconductor memory device 1 according to the present embodiment makes it possible to read data associated with the threshold at any bit even if the word lines WL1-WL4 are driven with a common potential and the selection gate lines SGS1-SGS3 with a common potential.

[Programming]

Figure 7:
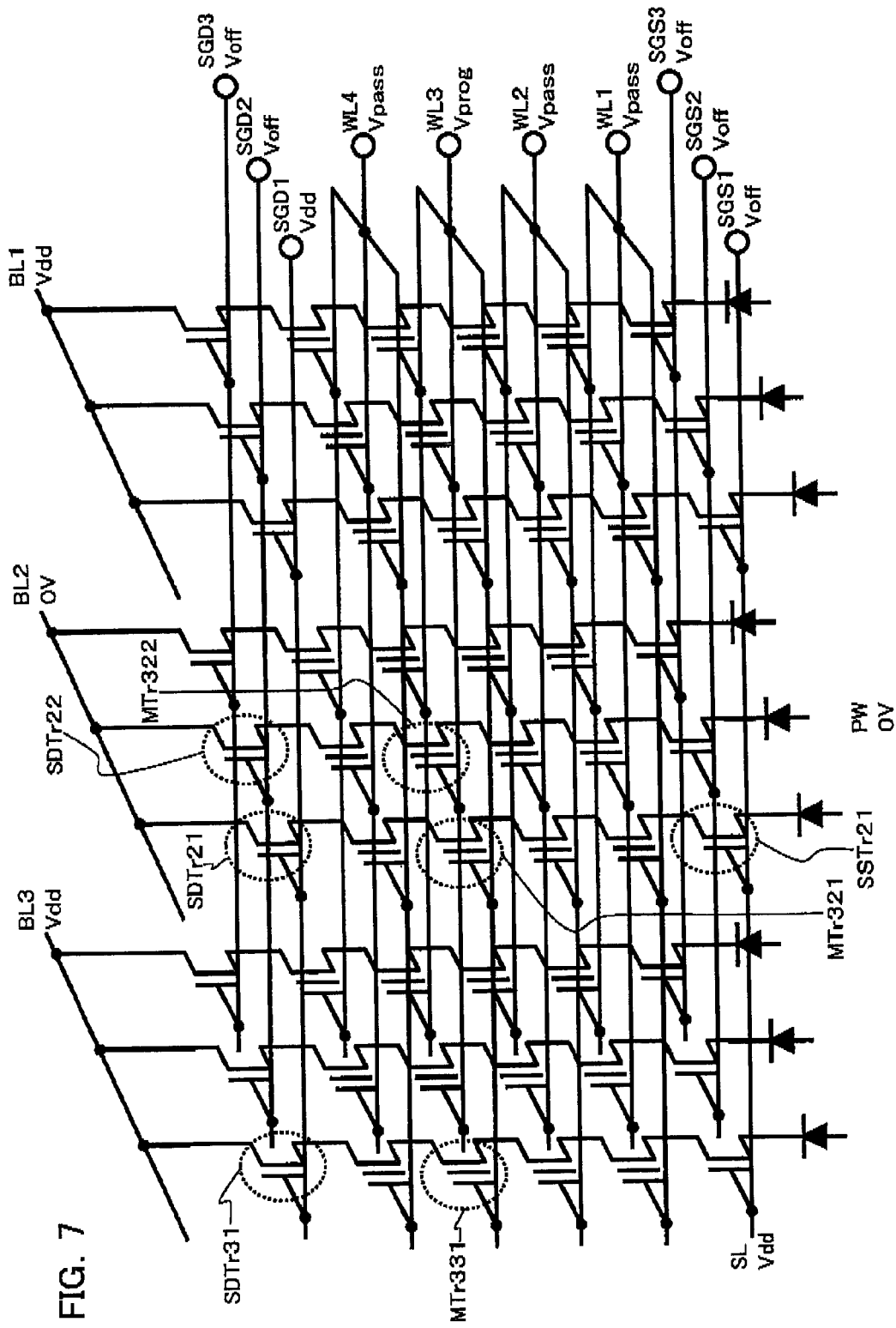
FIG. 7 is phase diagram on programming in the nonvolatile semiconductor memory device.

FIG. 7 shows a phase diagram of biases on programming data in the memory transistor MTr321 shown with the dotted line in the nonvolatile semiconductor memory device 1 according to the present embodiment.

On programming data "0" in the memory transistor MTr3, electrons are injected into the charge storage layer in the memory transistor MTr321 to elevate the threshold of the memory transistor (shift the threshold positively). In this case, 0 V is applied to the bit line BL2 connected to the memory transistor MTr321; Vdd to other bit lines BL; Vdd to the source line SL; Vdd to the selection gate line SGD1 connected to the memory transistor MTr321; Voff to other selection gate lines SGD; Voff to the selection gate lines SGS1-SGS3; and VPW (e.g. 0 V) to the P-Well region. In addition, Vprog (e.g. 18 V) is applied to the word line WL3 associated with the program-target bit (MTr321); and Vpass (e.g. 10 V) to other word lines WL. As a result, in the MTr321-belonging memory string 10, channels are formed in all the memory transistors MTr121, MTr221, MTr321 and MTr421 except the selection gate transistor SSTr21 connected to the source-side selection gate line SGS1, thereby transferring the potential (0 V) on the bit line BL2. This enhances the strength of the electric field placed across the ONO film containing the charge storage layer present between the word line associated with the desired bit (MTr321) and the semiconductor pillar. Thus, electrons can be injected into the charge storage layer to positively shift the threshold of the memory transistor MTr321.

In this case, as for the memory transistor MTr322, the source-side selection gate line SGS2 is supplied with Voff. Accordingly, the potential on the bit line BL2 can not be transferred to the channel in the memory transistor MTr322, and no injection of electrons occurs in the memory transistor MTr322. This is similar to all memory strings 10 that are connected to the bit line BL2 but the memory transistor MTr321 does not belong thereto.

In addition, as for the memory transistor MTr331, in the MTr331-belonging memory string 10, the source of the selection transistor SDTr31 connected to the selection gate line SGD1 is at a potential of Vdd and the bit line BL3 is also at a potential of Vdd. Therefore, in the selection transistor SDTr31, the potential on the source is equal to the potential on the gate. Accordingly, the selection transistor SDTr31 can not be turned on and no external potential is transferred to the channel in the memory transistor MTr321. Thus, no electron injection occurs. This is similar to all memory strings 10 that are not connected to the bit line BL2.

On programming data "1" in the memory transistor MTr321, the threshold of the memory transistor MTr321 is not elevated from the erased state (to inject no electron into the charge storage layer). In this case, application of Vdd to the bit line BL2 makes the potential on the gate of the selection transistor SDTr21 equal to the potential on the source thereof. Therefore, the selection transistor SDTr21 is turned off to reduce the potential difference between the channel region (body) in the memory transistor MTr3 and the word line WL3. Accordingly, no injection of electrons into the charge storage layer arises in the memory transistor MTr321. The similar operation can be used to program data in other bits (memory transistors MTr1mn: l=1-4, m=1-3, n=1-3 in the example shown in FIG. 7).

Setting each bit line BL at 0 V or Vdd makes it possible to execute simultaneous programming, that is, page programming of bits (MTr) on a common word line WL selected by a certain selection gate line SGD.

[Erasing]

Figure 8:
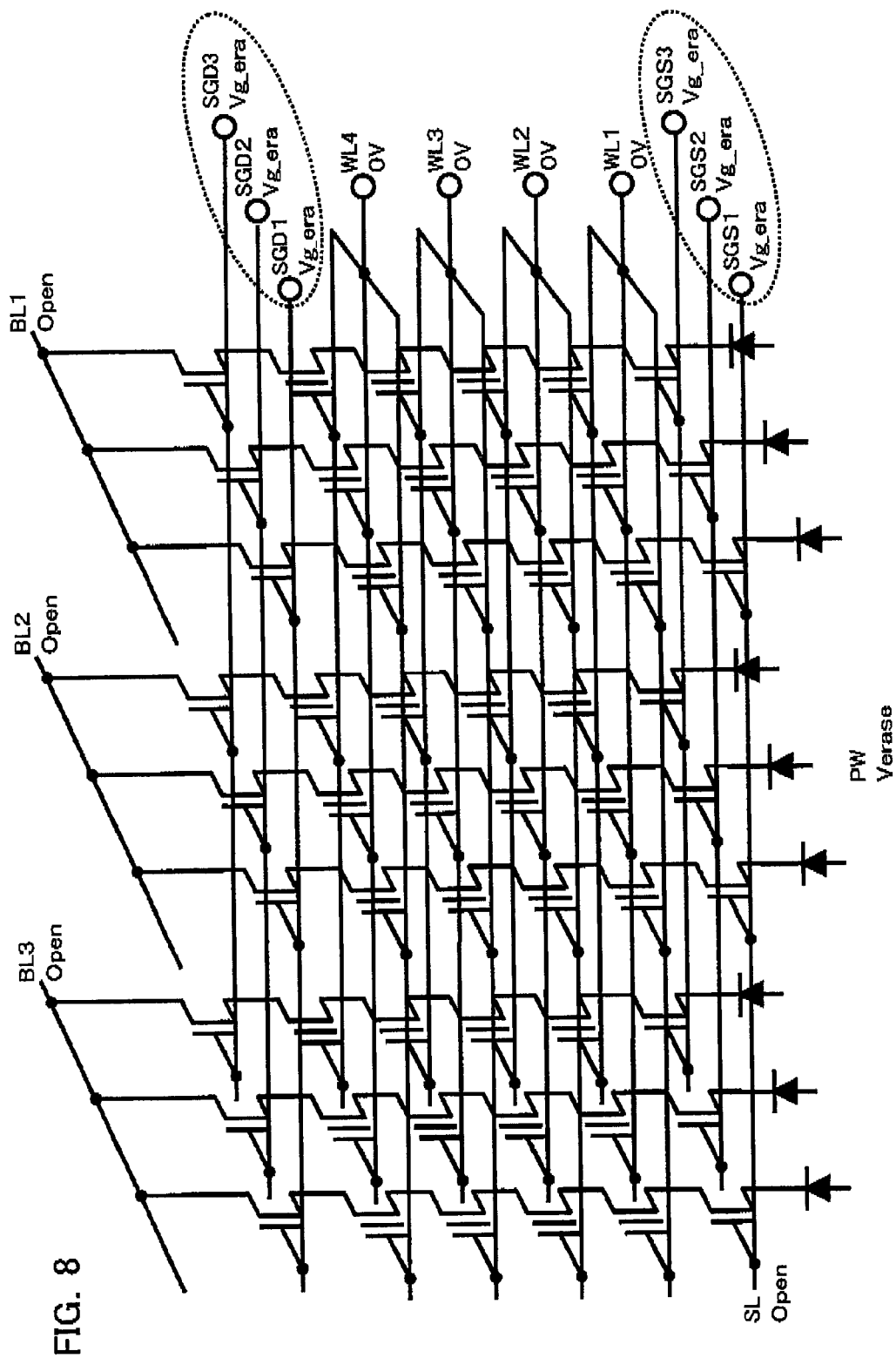
FIG. 8 is a phase diagram of a selected block on erasing in the nonvolatile semiconductor memory device.
Figure 9:
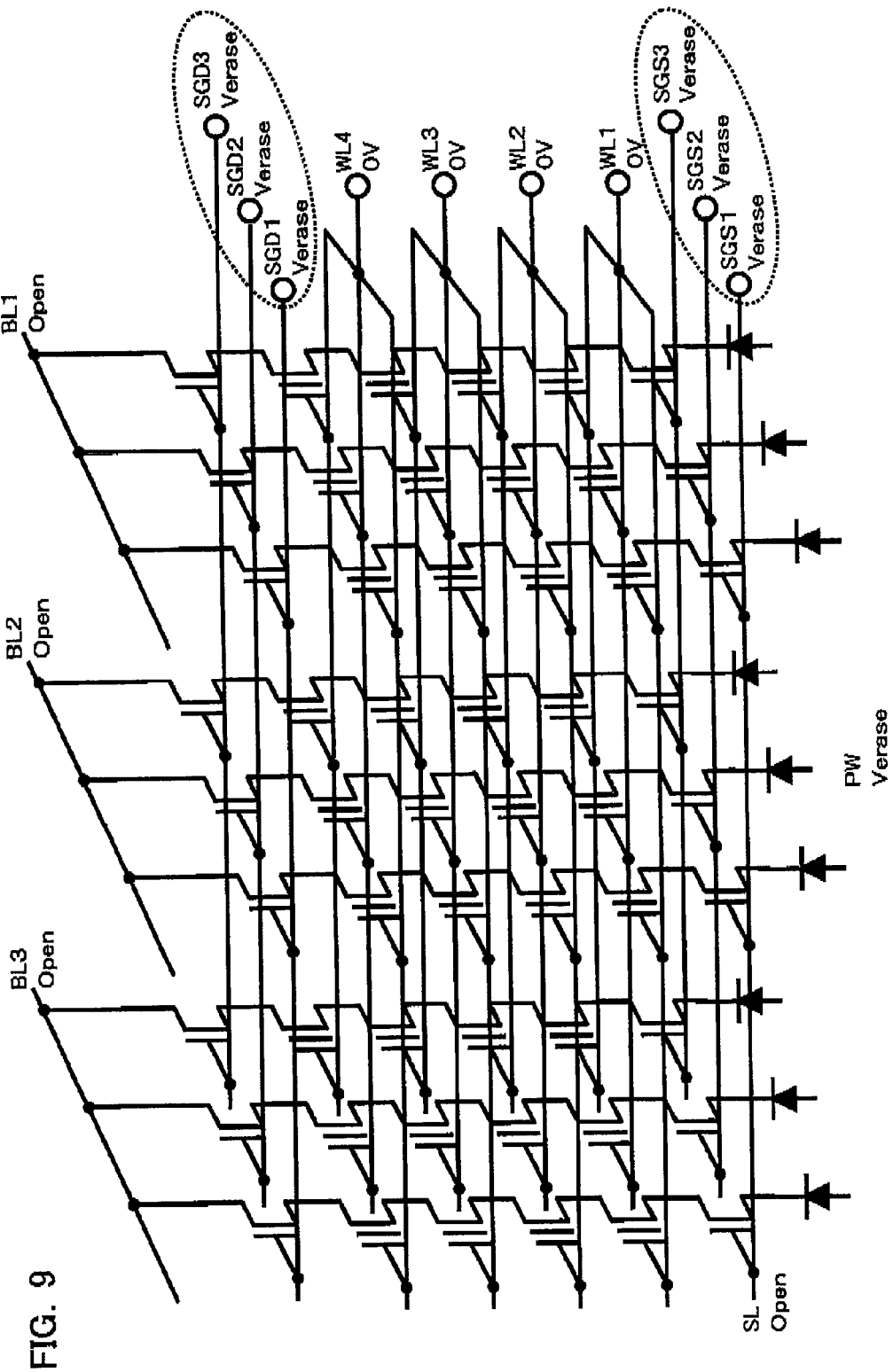
FIG. 9 is a phase diagram of a non-selected block on erasing in the nonvolatile semiconductor memory device.

On erasing data, in a block of plural memory strings, data is erased from the memory transistors MTr. FIGS. 8 and 9 show phase diagrams of biases on erasing data from the memory transistors MTr in a selected block in the nonvolatile semiconductor memory device 1 according to the present embodiment.

In a selected block (erase-target block), Verase (e.g. V) is applied to the P-well region (PW), and the source line SL is floated. In addition, the potentials on the selection gate lines SGS and SGDn are elevated (e.g. 15 V) with a slight time shift (e.g. around 4 μs) from the timing of application of Verase to the P-well region. As a result, GIDL (Gate Induced Drain Leak) current arises in the vicinity of the gate end of the selection transistor SSTr. In this case, the resultant holes flow in the semiconductor layer 11 or the body of the memory transistors MTr while electrons flow toward the P-well region. Thus, a potential near Verase is transferred to the channel region (body) in the memory transistor MTr. Accordingly, if the word lines WL1-WL4 are set at 0 V, electrons in the charge storage layers in the memory transistors MTr are drawn to the P-well region to erase data.

On erasing data from the memory transistors in a selected block, on the other hand, the word lines WL1-WL4 are floated in non-selected blocks. As a result, in accordance with the elevation of the potentials on the channel region (body) in the memory transistors MTr1-MTr4, the potentials on the word lines WL1-WL4 rise by coupling. In this case, no potential difference arises between the word lines WL1-WL4 and the charge storage layer in the memory transistors MTr1-MTr4 and accordingly electrons are not drawn (erased) from the charge storage layer.

FIG. 10 shows relations among potentials at the time of "reading", "programming" and "erasing" in the nonvolatile semiconductor memory device according to the present embodiment.

Referring to FIGS. 11-30, a process of manufacturing the nonvolatile semiconductor memory device according to the present embodiment, specifically a process of manufacturing in a memory transistor region is described.

Figure 11:
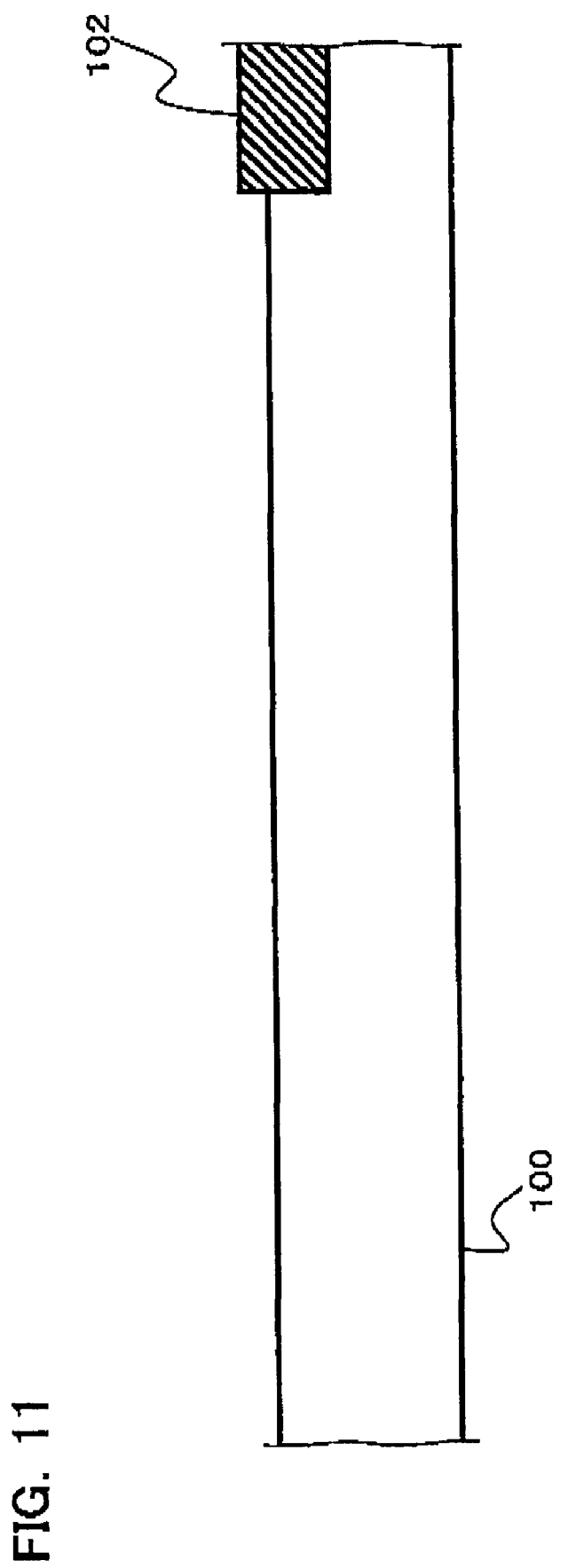
FIG. 11 is a diagram of the process step (1) of manufacturing a nonvolatile semiconductor memory device in a first embodiment.

First, there is provided a semiconductor substrate 100 as shown in FIG. 11, on which a thin silicon oxide ($SiO_2$) is formed (not shown), and subsequently a silicon nitride ($Si_3N_4$) is deposited thereon (not shown). A dry etching is then applied to form a shallow trench of around 300 nm in a region used to forma STI (Shallow Trench Isolation) 102. Thereafter, a thermal CVD processor a plasma CVD process is applied to deposit a silicon oxide to fill the trench with the silicon oxide completely. A process of chemical mechanical polishing (CMP) is then used to remove the silicon oxide from other portions than the trench to form the STI (Shallow Trench Isolation) 102. Thereafter, the remaining silicon nitride is removed with a hot phosphoric acid or the like.

Figure 12:
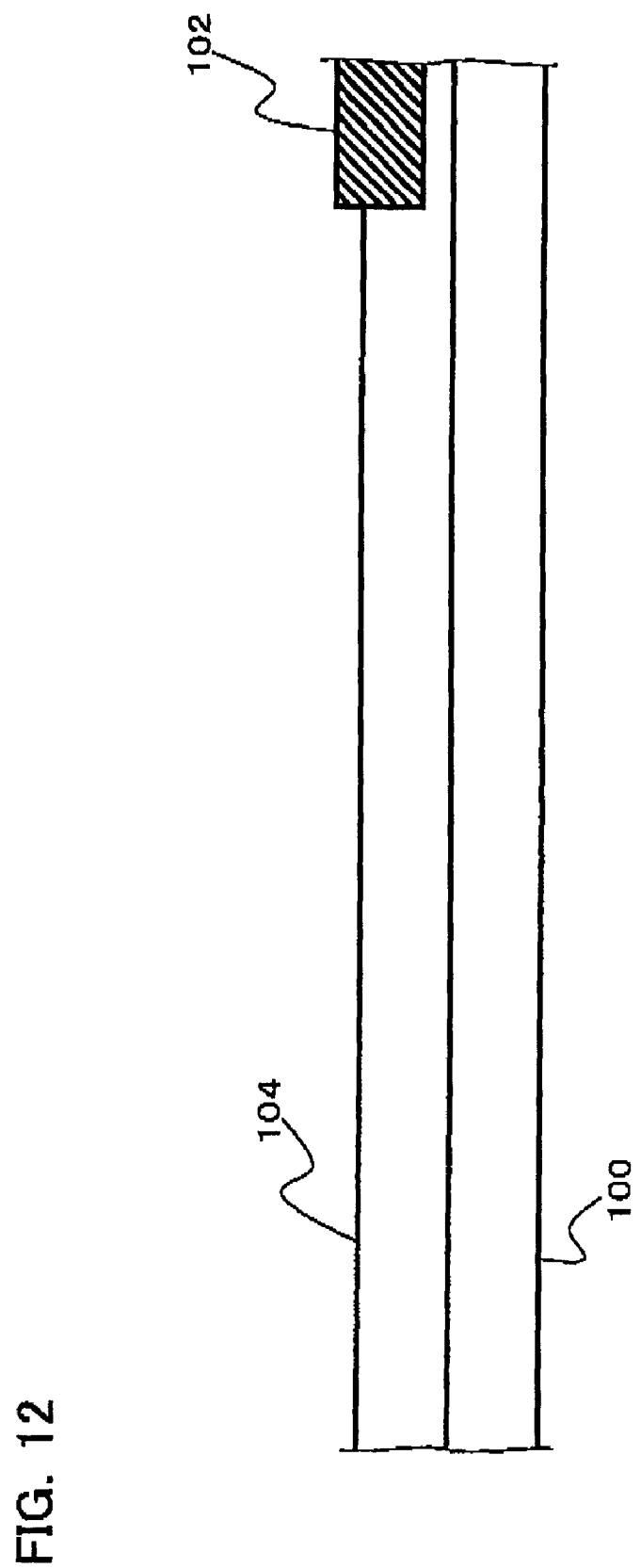
FIG. 12 is a diagram of the process step (2) of manufacturing the nonvolatile semiconductor memory device in the first embodiment.

Next, the substrate surface is subjected to sacrifice oxidation (not shown), followed by forming a photoresist pattern with apertures in desired regions, and implanting boron (B) ions to form a P-well region 104 as shown in FIG. 12. Subsequently, the resist is removed. Thereafter, a photoresist pattern is formed with apertures in desired regions, not shown, followed by implanting boron (B) ions into a region near the surface to form a channel implanted-region to adjust the threshold Vth of a transistor, and form an N-channel transistor in a peripheral circuit region. In contrast, implantation of ions giving the N-type in a desired region may be applied to form an N-well region, and then form a P-channel transistor.

Figure 13:
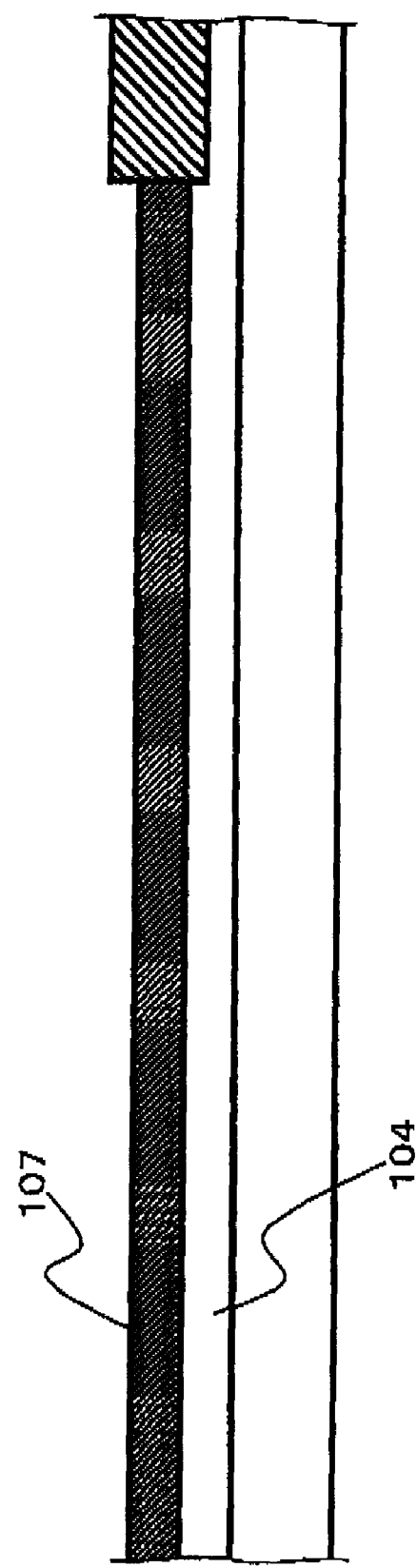
FIG. 13 is a diagram of the process step (3) of manufacturing the nonvolatile semiconductor memory device in the first embodiment.

Subsequently, a photoresist pattern is formed with apertures in the memory transistor region, followed by implanting phosphorous (P) ions into the memory cell transistor region to form an $N^+$-type diffused region 107 as shown in FIG. 13. The $N^+$-type diffused region 107 is turned into the source line SL.

Next, the sacrifice oxidation film (not shown) is removed, and a first gate insulator (not shown) is formed. Then, a photoresist mask is formed in a desired pattern, followed by wet etching to etch off the first gate insulator from desired positions and part of the STI 102 (not shown). This region is used to form high-speed operating, thin-film gate transistors and the region not exposed to the wet etching is used to form high-breakdown voltage, thick-film gate transistors.

Subsequently, the photoresist mask is removed, and a second gate insulator (not shown) is formed. Then, a polysilicon (p-Si) film (not shown) doped with a conductive impurity such as P (phosphorous) is formed over the substrate. The polysilicon film is then etched in a desired pattern to form the gate electrodes of transistors in the peripheral circuit region (not shown). A photoresist (not shown) is formed over the P-channel transistor region in the peripheral circuit region and the memory transistor region. Then, P or As ions are implanted into the N-channel transistor region in the peripheral circuit region to form a shallow N-type region in a self-aligned manner with the gate electrode (not shown). Thereafter, the photoresist is removed.

Next, a photoresist (not shown) is formed over the N-channel transistor region in the peripheral circuit region and the memory transistor region. Then, B ions or the like are implanted into the P-channel transistor region in the peripheral circuit region to form a shallow P-type region in a self-aligned manner with the gate electrode (not shown). Thereafter, the photoresist is removed.

Subsequently, a silicon nitride is formed over the entire surface of the substrate, followed by anisotropic etching to leave the silicon nitride only on both ends of the gate electrode to form a sidewall (not shown).

Next, a photoresist (not shown) is formed over the P-channel transistor region in the peripheral circuit region and the memory transistor region. Then, arsenic (As) ions are implanted into the N-channel transistor region in the peripheral circuit region to form a source/drain region (not shown) in a self-aligned manner with the sidewall. Thereafter, the photoresist is removed.

Then, a photoresist (not shown) is formed over the N-channel transistor region in the peripheral circuit region and the memory transistor region. Then, B ions are implanted into the P-channel transistor region in the peripheral circuit region to form a source/drain region (not shown) in a self-aligned manner with the sidewall. Thereafter, the photoresist is removed.

Figure 14:
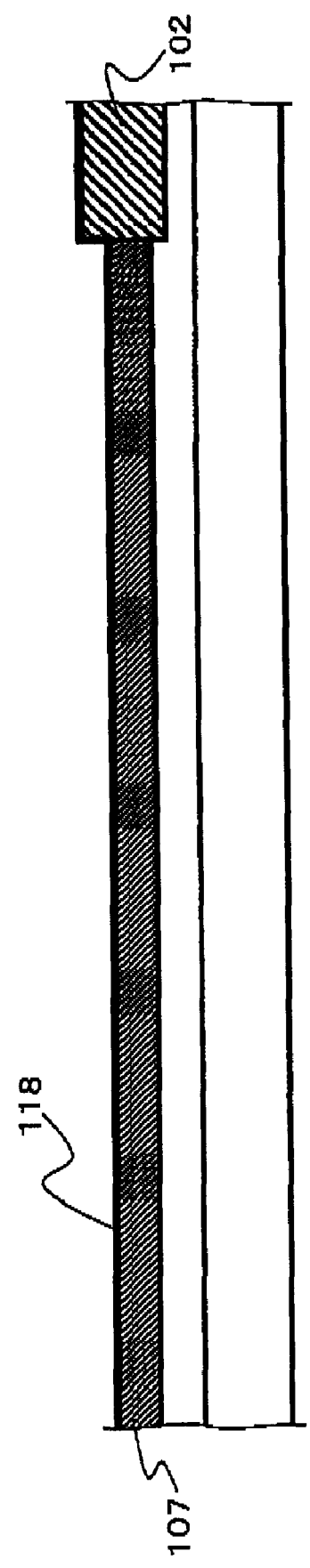
FIG. 14 is a diagram of the process step (4) of manufacturing the nonvolatile semiconductor memory device in the first embodiment.

Next, as shown in FIG. 14, a silicon nitride (barrier silicon nitride) 118 is formed over the entire surface of the substrate. As pattering process is then applied to form a cobalt (Co) film over the entire surface of the substrate, followed by heating to form a cobalt silicide ($CoSi_2$) (not shown). Thereafter, undesired Co is removed. The cobalt silicide may be formed on the gate electrode. Alternatively, a silicide of another metal (such as Ti and Ni) may be formed. In this case, at the time of depositing polysilicon for the gate electrode, a tungsten silicide and SiN may be formed on the polysilicon successively, followed by processing the gate and forming the transistor.

Figure 15:
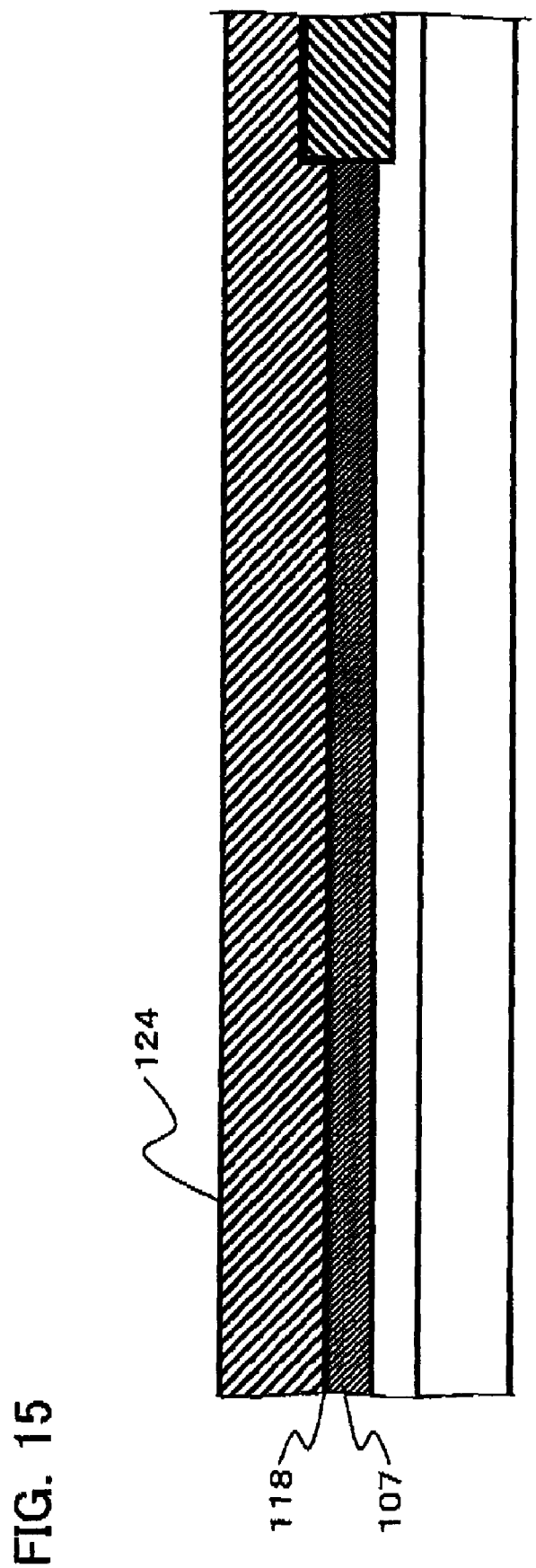
FIG. 15 is a diagram of the process step (5) of manufacturing the nonvolatile semiconductor memory device in the first embodiment.

Subsequently, a BPSG (Boron Phospho Silicate Glass) film 124 is formed over the entire surface of the substrate as shown in FIG. 15, and a CMP process is applied to planarize the BPSG film.

Figure 16:
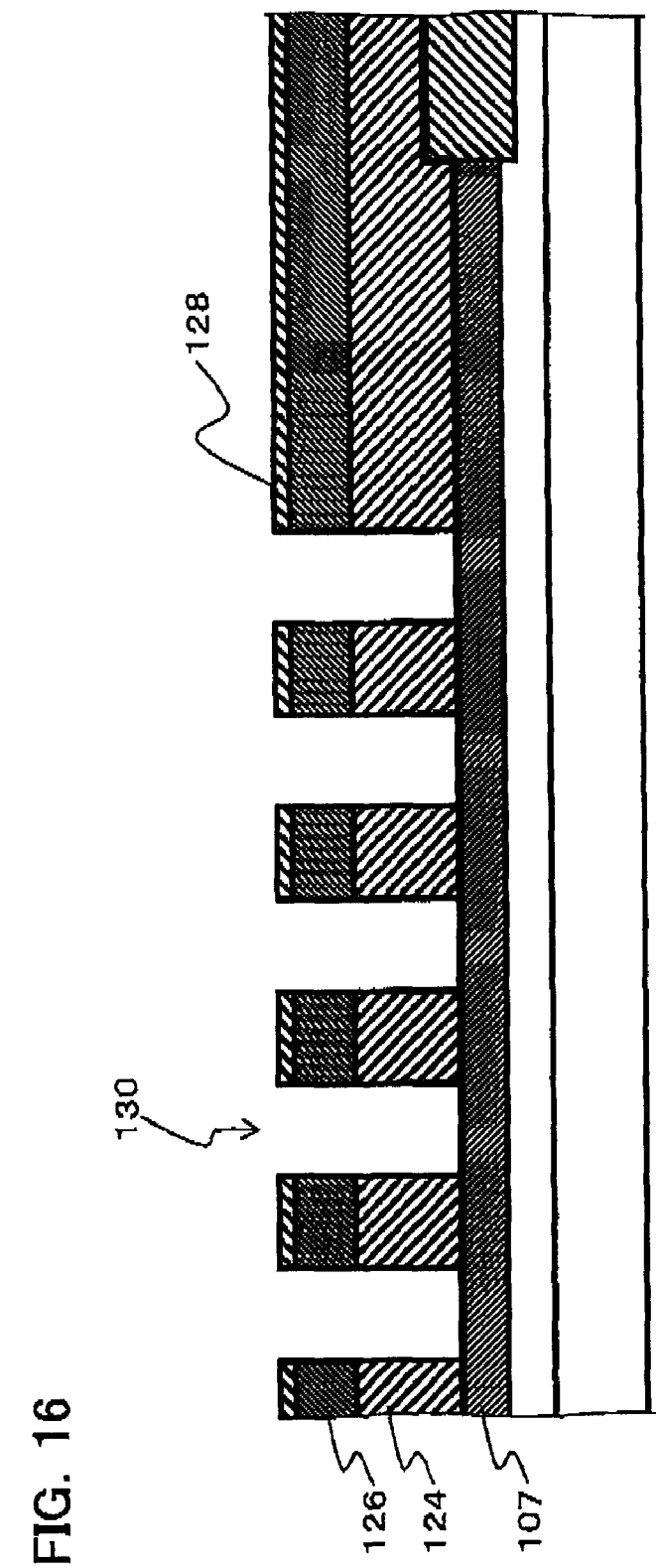
FIG. 16 is a diagram of the process step (6) of manufacturing the nonvolatile semiconductor memory device in the first embodiment.

Next, a polysilicon film 126 doped with a conductive impurity such as P (phosphorous) is formed over the substrate and a silicon nitride 128 formed thereon as shown in FIG. 16. Thereafter, a photoresist process is applied to form holes (hereinafter also referred to as "transistor plugholes") 130. The polysilicon film 126 is turned into the selection gate line SGS in the memory transistor region.

Figure 17:
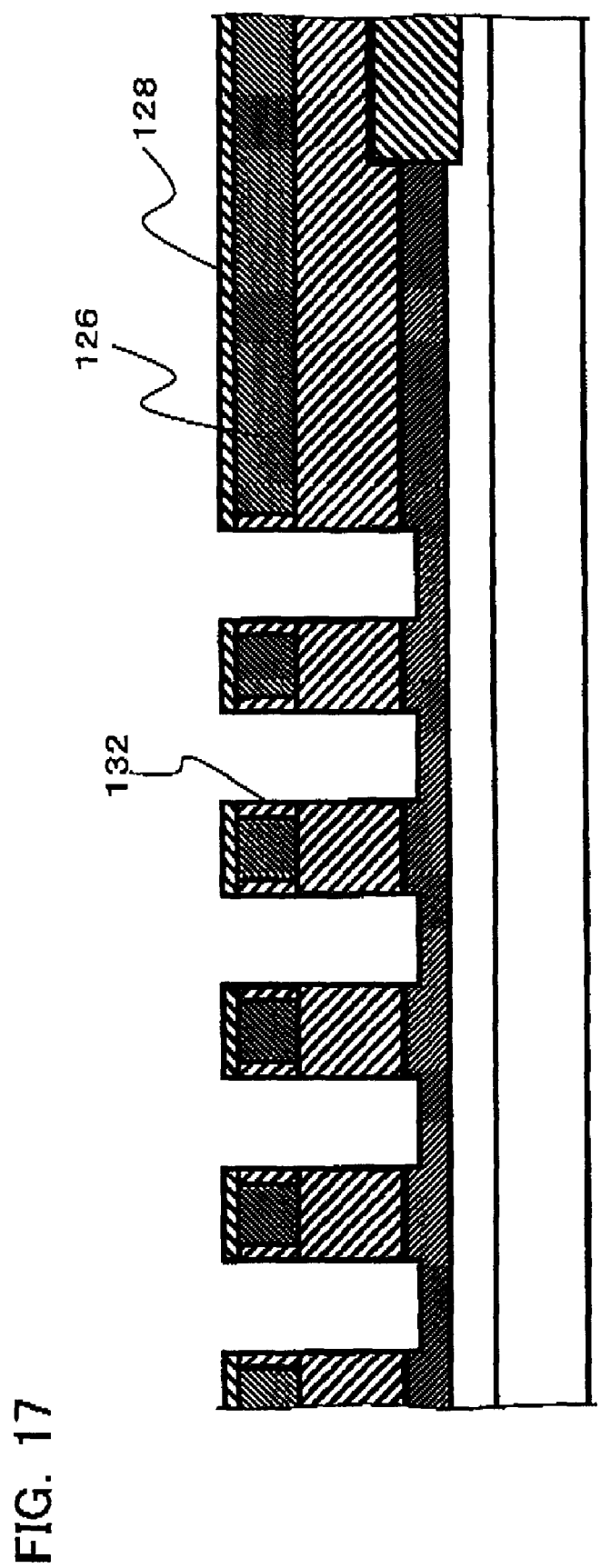
FIG. 17 is a diagram of the process step (7) of manufacturing the nonvolatile semiconductor memory device in the first embodiment.

Then, the substrate is heated to form a thermal oxide 132 as shown in FIG. 17. The thermal oxide 132 is turned into the gate insulator in the selection gate transistor SSTr.

Subsequently, a silicon nitride is formed over the entire surface of the substrate, followed by anisotropic etching to form a block silicon nitride. Thereafter, a wet etching with a HF acid or a dry etching with a fluorine-based gas is applied to remove part of the thermal oxide (not shown).

Figure 18:
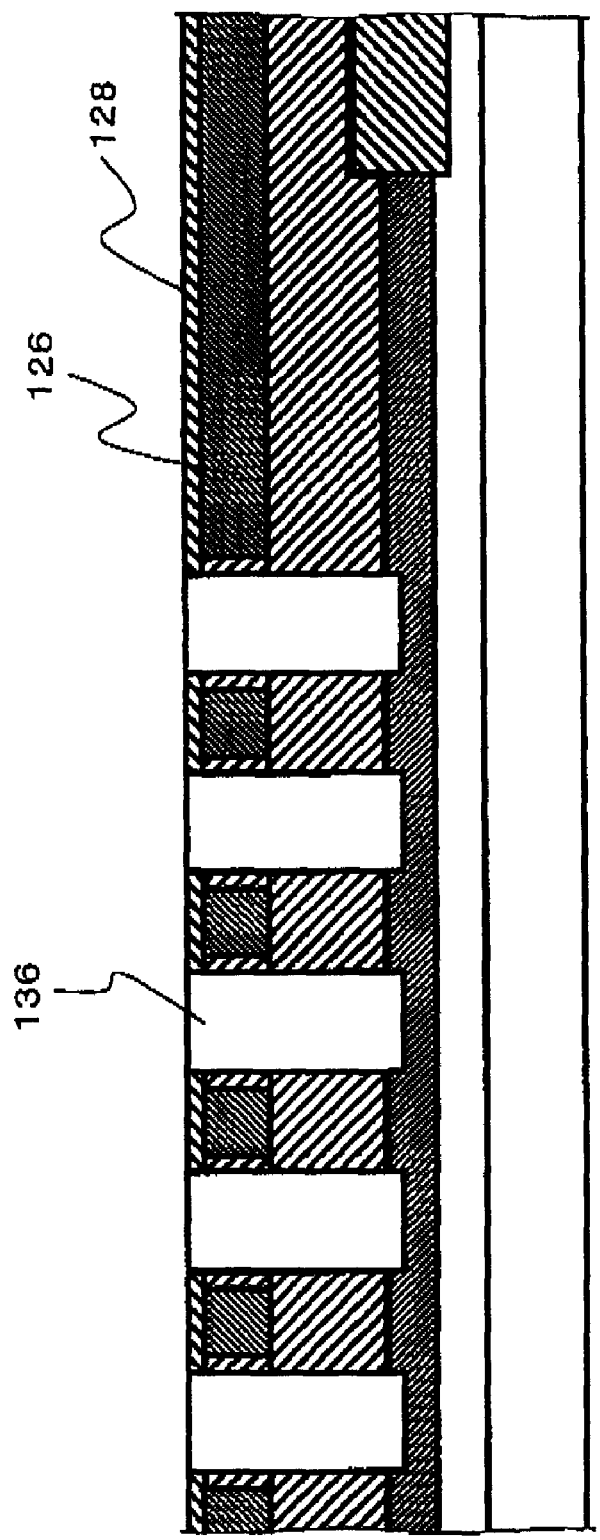
FIG. 18 is a diagram of the process step (8) of manufacturing the nonvolatile semiconductor memory device in the first embodiment.

Next, the block silicon nitride is removed, and then an amorphous silicon (a-Si) film is formed over the entire surface of the substrate. Thereafter, the amorphous silicon film is subjected to CMP to form an amorphous silicon film 136 as shown in FIG. 18. In place of the amorphous silicon film, single-crystal silicon may be epitaxially grown to form a silicon film 136.

Figure 19:
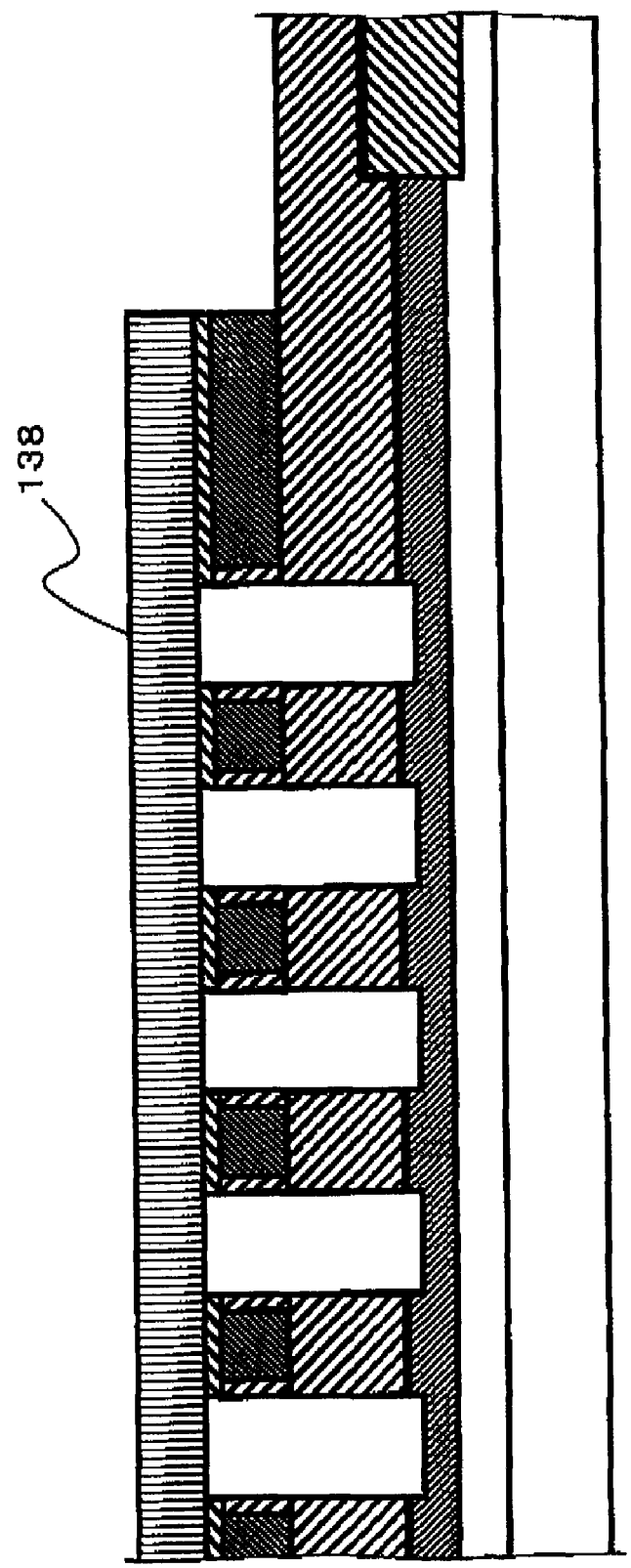
FIG. 19 is a diagram of the process step (9) of manufacturing the nonvolatile semiconductor memory device in the first embodiment.

Subsequently, a photoresist 138 is formed as shown in FIG. 19 and then subjected to a photo-etching process.

Figure 20:
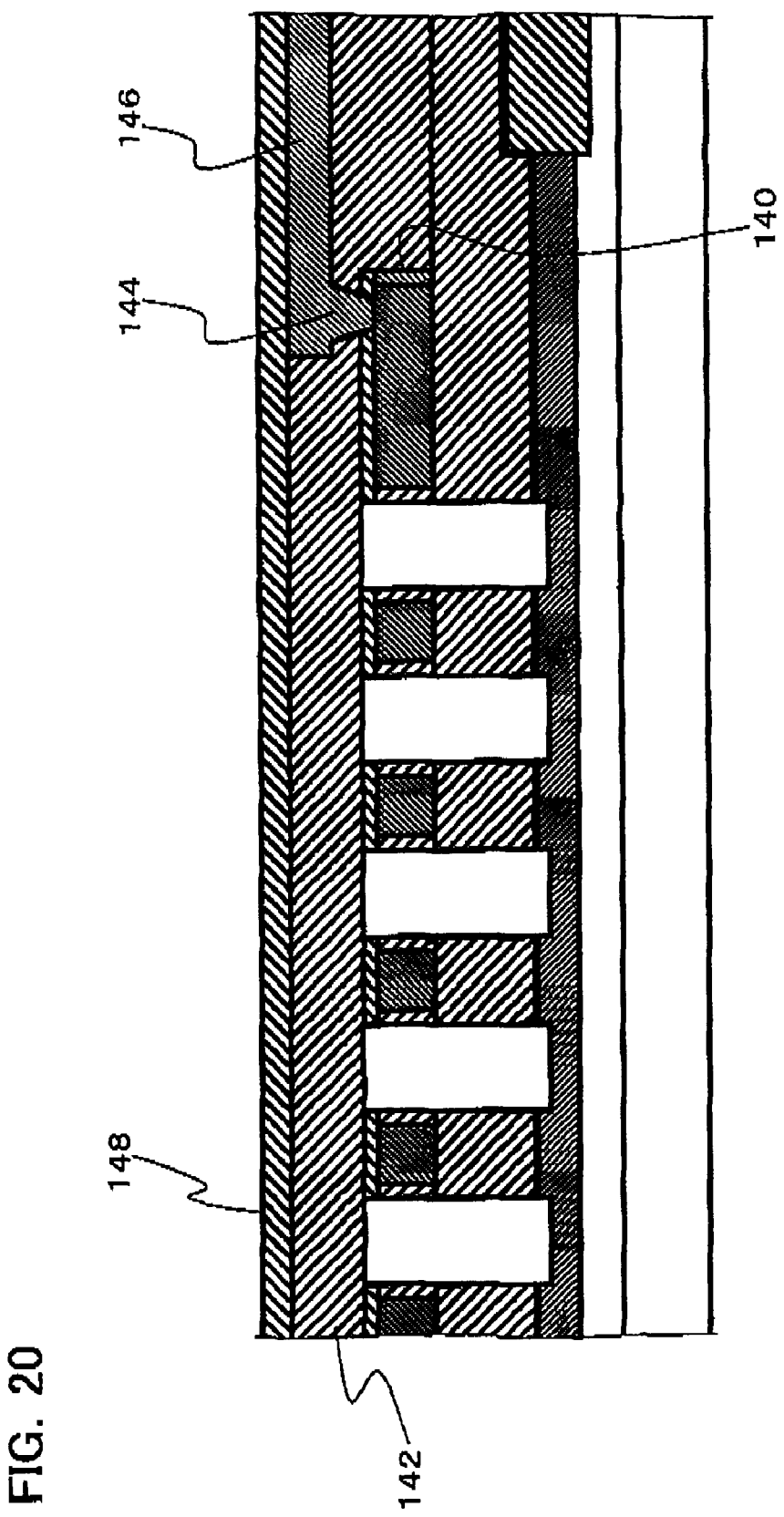
FIG. 20 is a diagram of the process step (10) of manufacturing the nonvolatile semiconductor memory device in the first embodiment.

Then, a titanium (Ti) film is formed and heated to form a titanium silicide (TiSi) 140 as shown in FIG. 20. In place of the titanium silicide (TiSi) 140, a cobalt silicide ($CoSi_2$) may be formed. The titanium silicide 140 may not be formed. Thereafter, a silicon oxide 142 is formed as a premetal dielectric (PMD). A photo-etching process is then applied to form contact holes. Thereafter, a wiring groove is formed in the silicon oxide 142, and the tungsten (W) is buried therein to form a tungsten (W) plug 144 and a wiring line 146. Next, a silicon oxide 148 is formed with TEOS (Tetraethoxysilane). Hereinafter, the silicon oxide formed with TEOS is also referred to as a "TEOS" film.

Figure 21:
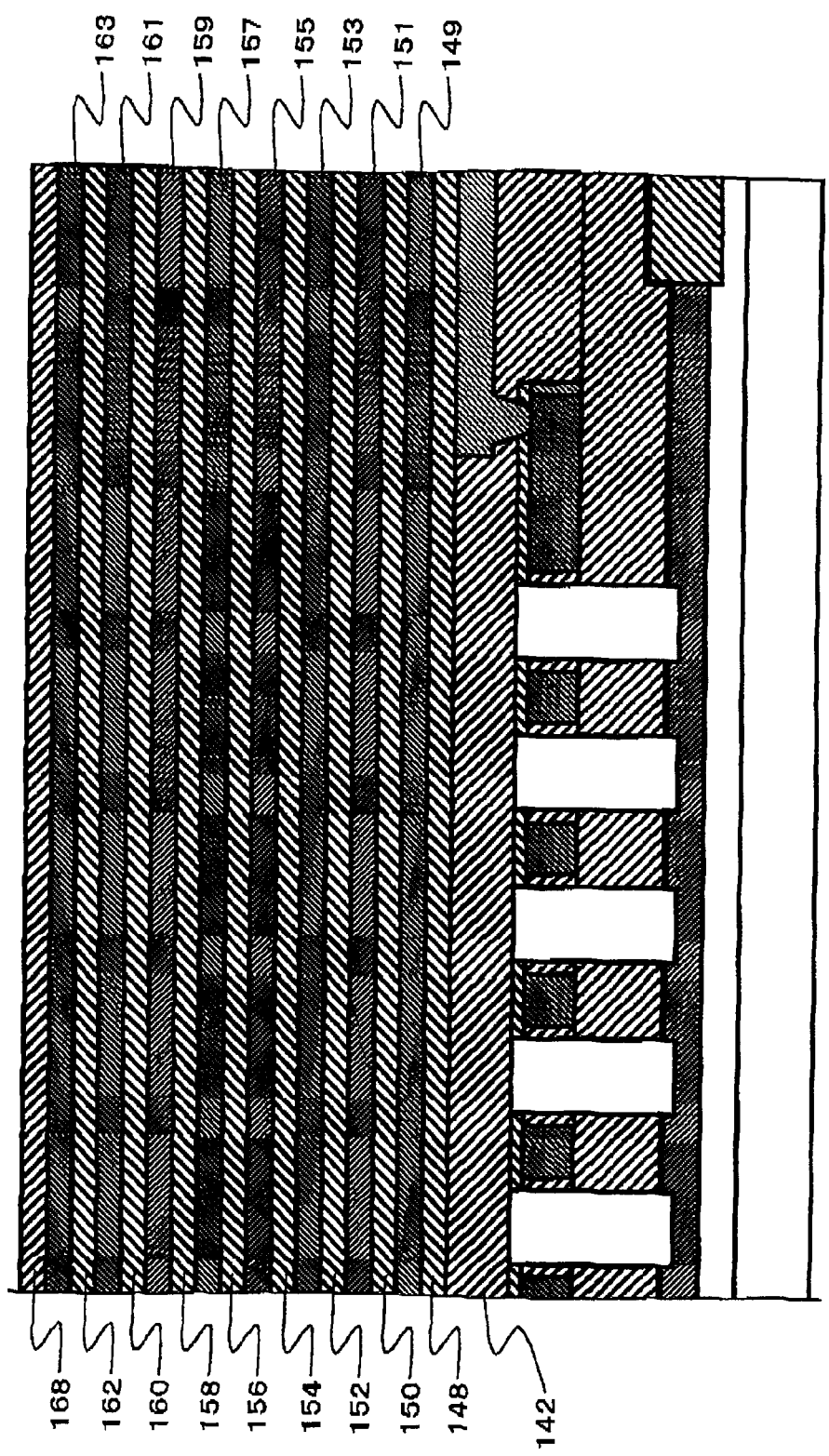
FIG. 21 is a diagram of the process step (11) of manufacturing the nonvolatile semiconductor memory device in the first embodiment.

Thereafter, a polysilicon (or amorphous silicon) film doped with a P-type impurity at high density, a silicon oxide, a polysilicon film doped with an N-type impurity at high density, and a silicon oxide are formed alternately as shown in FIG. 21. Thus, $P^+$-type polysilicon films 149, 153, 157, 161, 163, $N^+$-type polysilicon films 151, 155, 159 and silicon oxide films 148, 150, 152, 154, 156, 158, 160, 162 are formed.

A silicon nitride 168 is formed thereon, The $N^+$-type polysilicon films 151, 155, 159 are not connected to the word lines WL1-4 but turned into the interlayer electrodes IL1-3.

Figure 22:
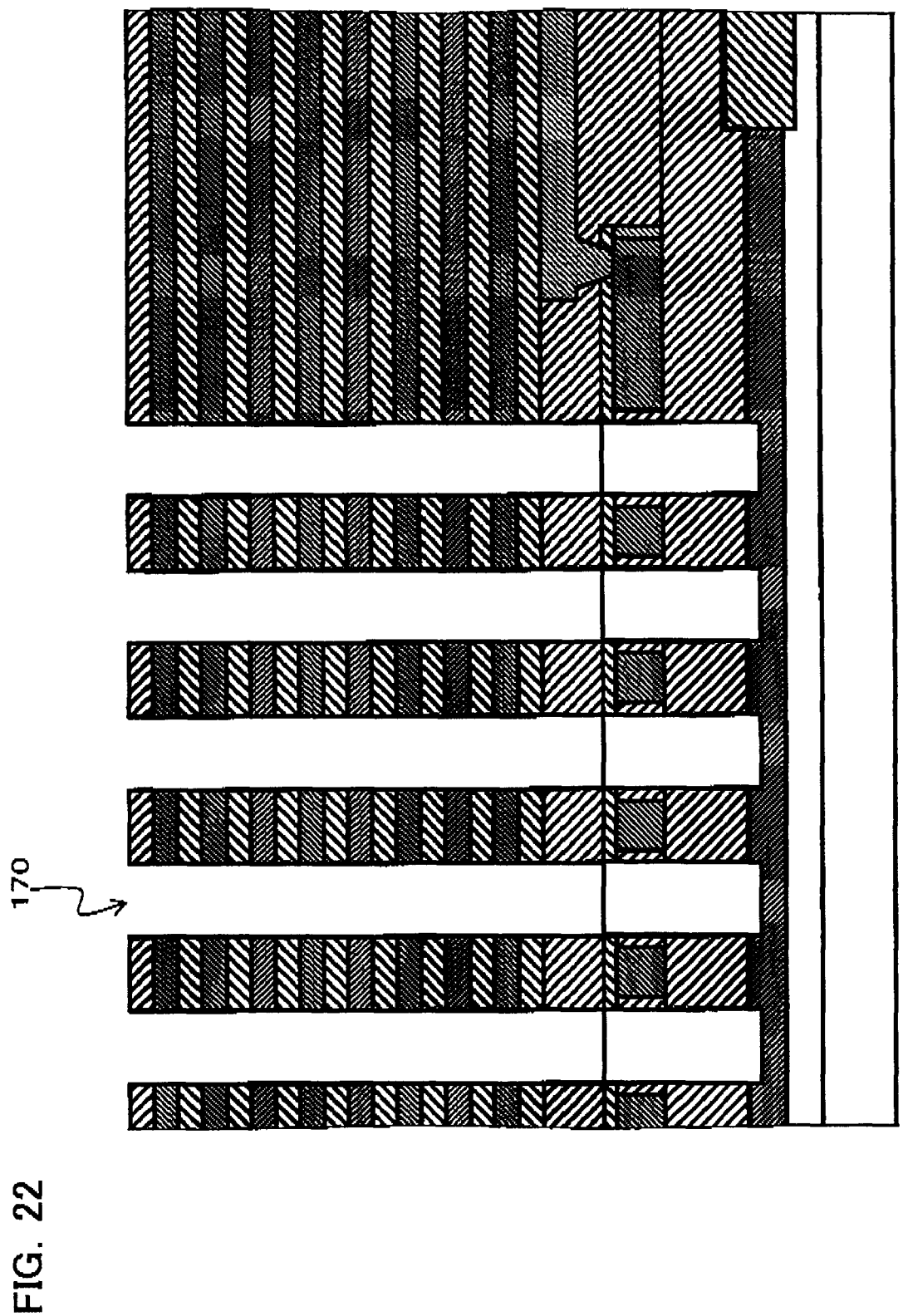
FIG. 22 is a diagram of the process step (12) of manufacturing the nonvolatile semiconductor memory device in the first embodiment.

Next, memory plugholes 170 are formed in the memory transistor region as shown in FIG. 22, each of which is used in formation of a semiconductor pillar (body) of the memory transistor.

Figure 23:
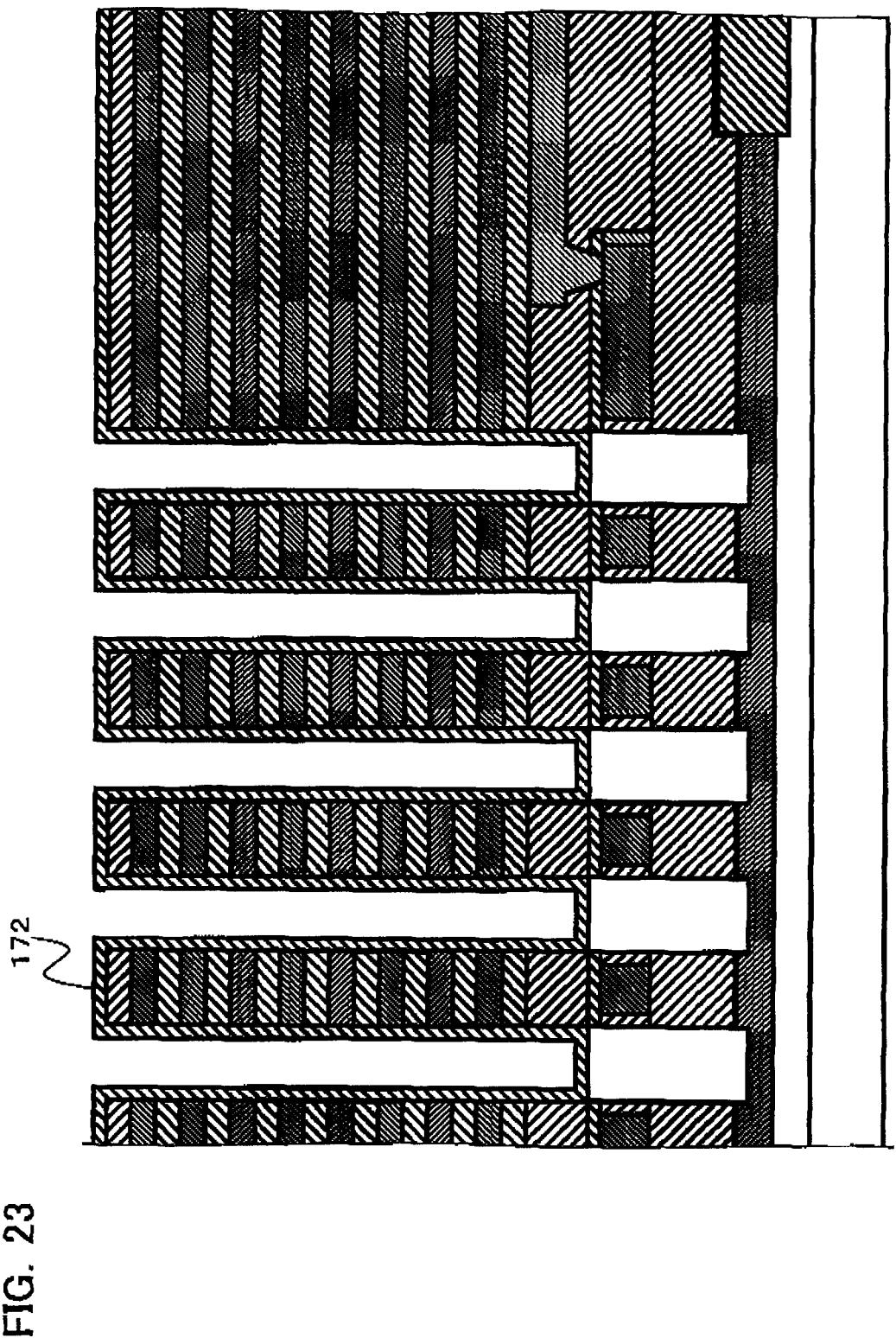
FIG. 23 is a diagram of the process step (13) of manufacturing the nonvolatile semiconductor memory device in the first embodiment.

Then, a silicon oxide, a silicon nitride and a silicon oxide are deposited in turn to form the so-called ONO film 172 as shown in FIG. 23. The silicon nitride in the ONO film 172 serves as the charge storage layer in the memory transistor.

Figure 24:
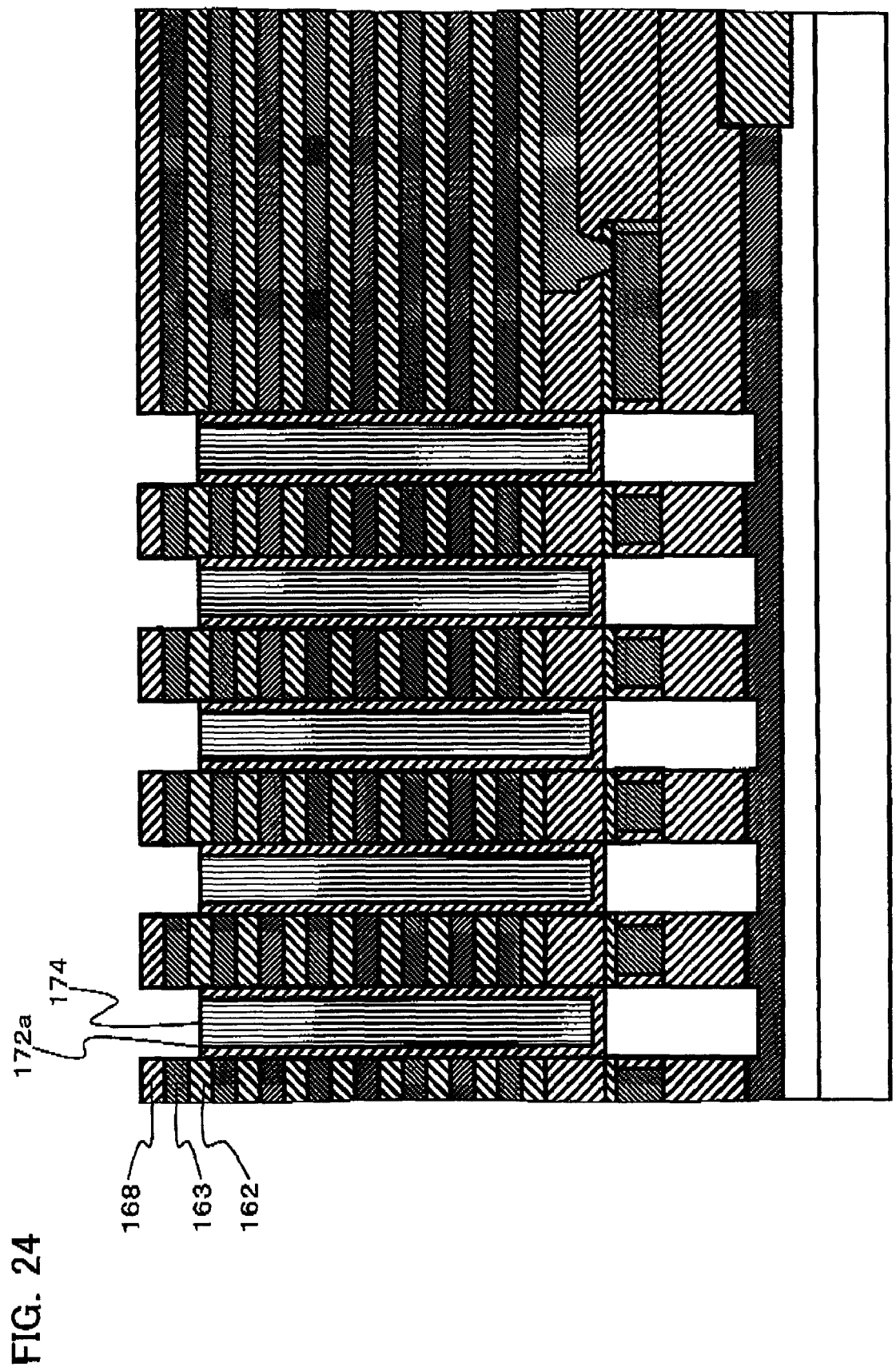
FIG. 24 is a diagram of the process step (14) of manufacturing the nonvolatile semiconductor memory device in the first embodiment.

Next, a photoresist is formed as shown in FIG. 24, followed by etching back to remove the ONO film in the peripheral circuit region, not shown, and part of the ONO film 172 in the memory transistor region. In the memory transistor region, the ONO film 172a and the photoresist 174 reside in the memory plughole 170 except the layer (polysilicon 163) for use in formation of the selection gate transistor SDTr and part of the lower silicon oxide 162.

Figure 25:
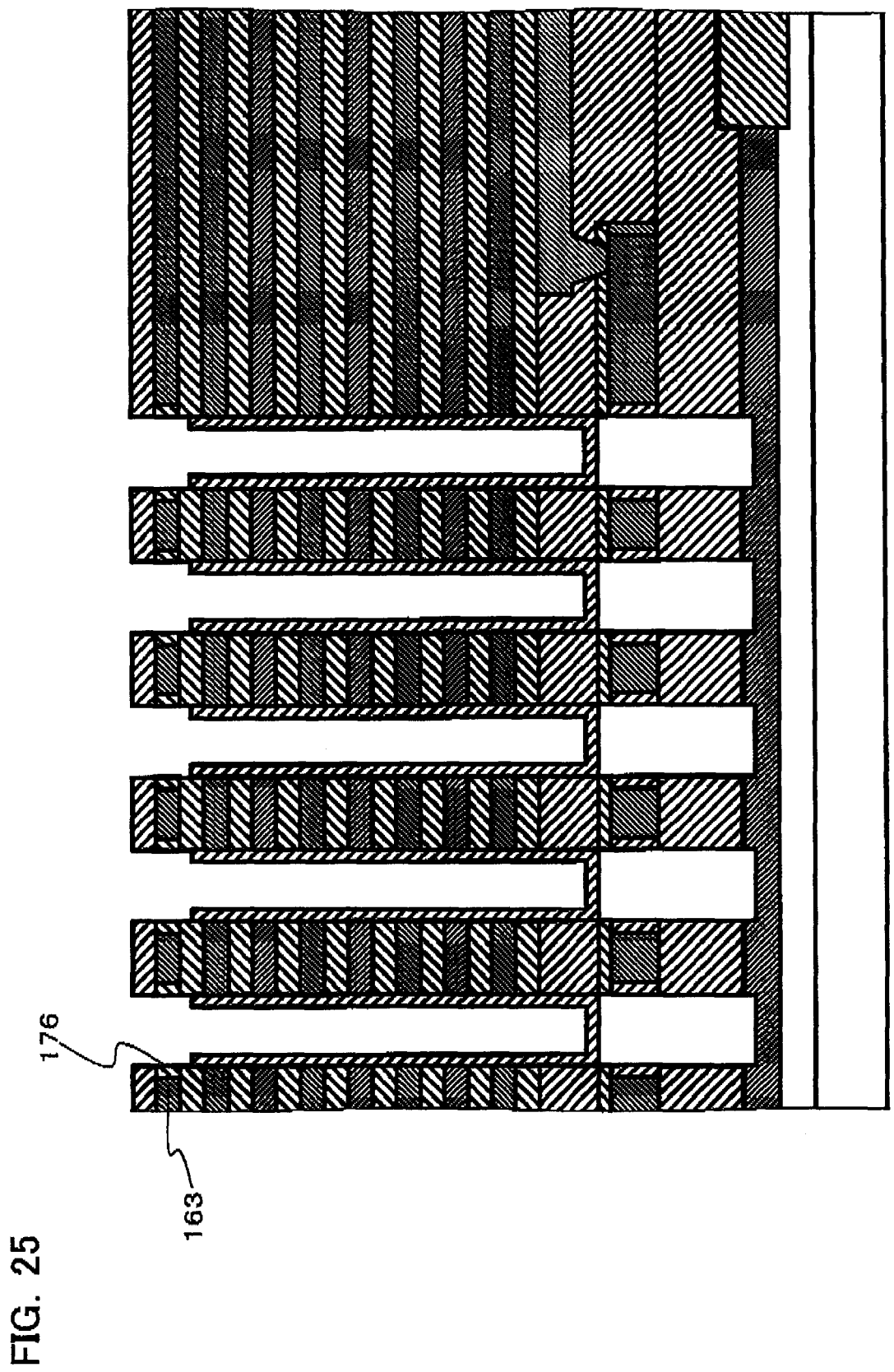
FIG. 25 is a diagram of the process step (15) of manufacturing the nonvolatile semiconductor memory device in the first embodiment.

Thereafter, the photoresist 174 is removed as shown in FIG. 25, followed by heating to form a thermal oxide 176 in the layer (polysilicon 163) for use in formation of the selection gate transistor SDTr. In place of formation of the thermal oxide, a silicon nitride 176 may be formed through a CVD process.

Figure 26:
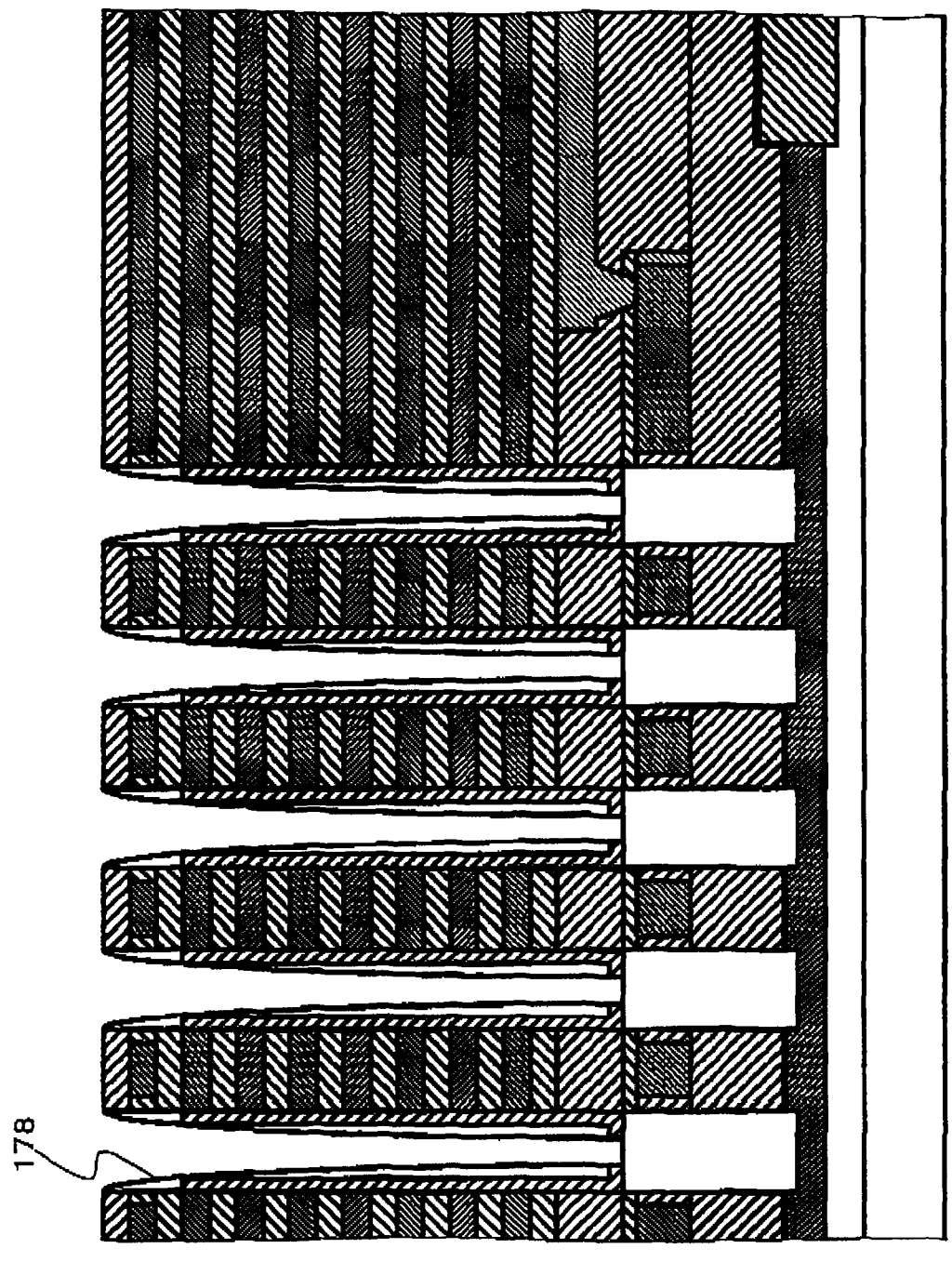
FIG. 26 is a diagram of the process step (16) of manufacturing the nonvolatile semiconductor memory device in the first embodiment.

Subsequently, a silicon nitride is formed over the entire surface of the substrate, followed by anisotropic etching to form a spacer silicon nitride 178 as shown in FIG. 26.

Figure 27:
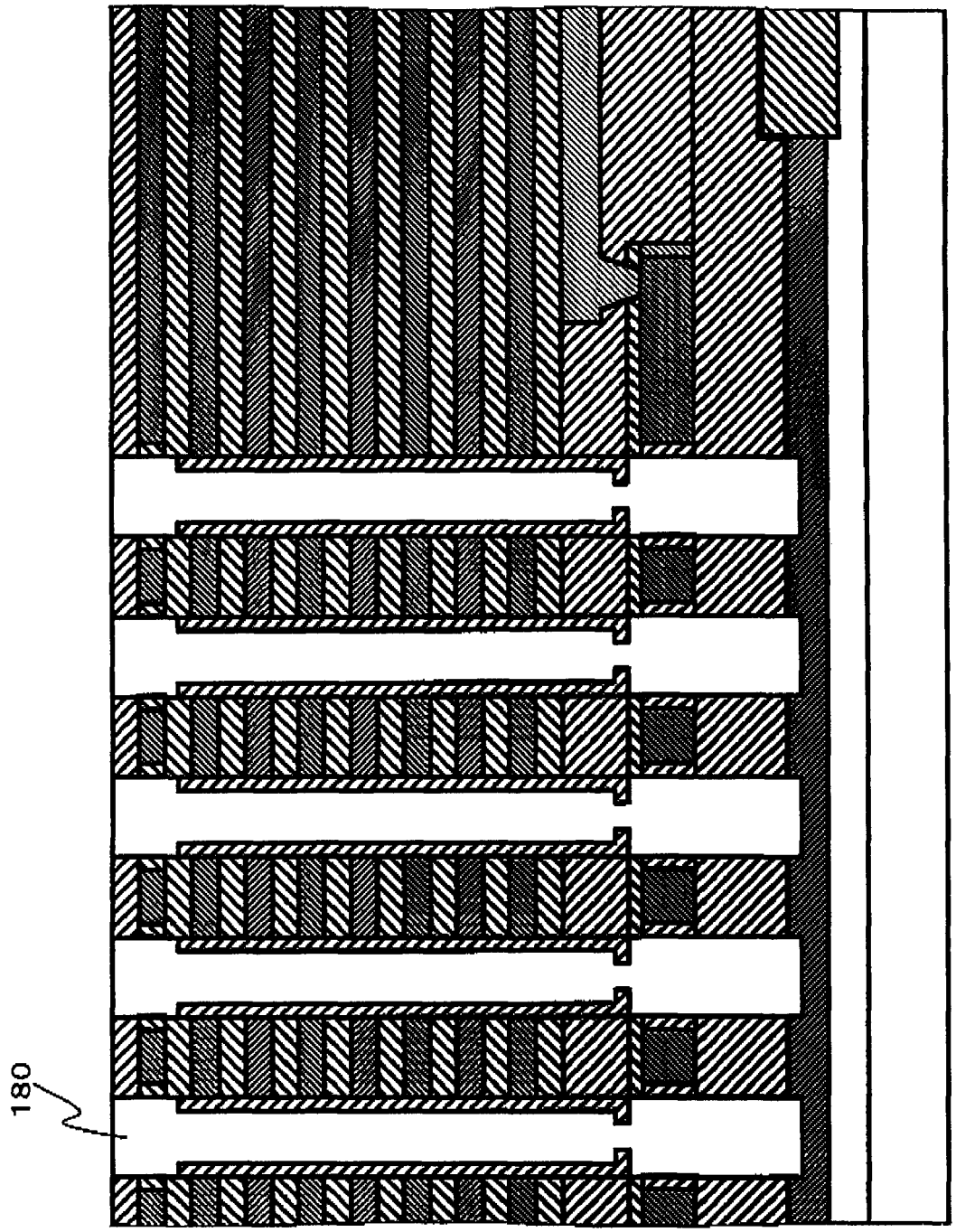
FIG. 27 is a diagram of the process step (17) of manufacturing the nonvolatile semiconductor memory device in the first embodiment.

Next, as shown in FIG. 27, the spacer silicon nitride 178 is removed, and an amorphous silicon film is then deposited, followed by a CMP process to form a pillar-shaped amorphous silicon layer 180. In place of deposition of the amorphous silicon film, a single-crystal silicon film may be epitaxially grown to form a single-crystal silicon layer 180. In formation by selective epitaxial growth in silicon inside the selection gate transistor SSTr in the lower layer, the single-crystal silicon layer 180 may be formed similarly by selective epitaxial growth.

Figure 28:
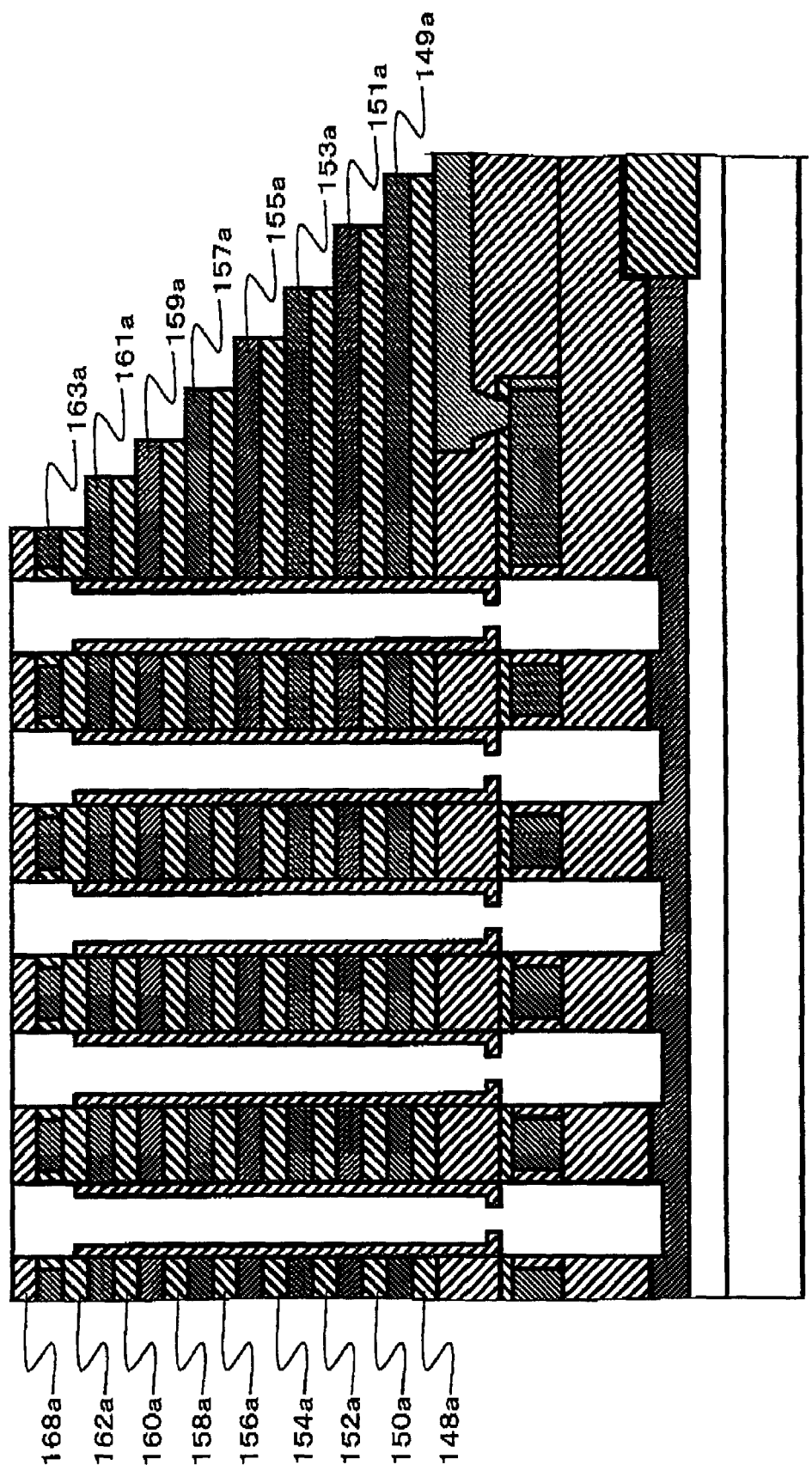
FIG. 28 is a diagram of the process step (18) of manufacturing the nonvolatile semiconductor memory device in the first embodiment.

The silicon nitride 168, the $P^+$-type polysilicon films 149, 153, 157, 161, 163, the $N^+$-type polysilicon films 151, 155, 159 and the silicon oxide films 148, 150, 152, 154, 156, 158, 160, 162 have ends in respective layers. These ends are stepwise etched in steps to form a silicon nitride 168a, $P^+$-type polysilicon films 149a, 153a, 157a, 161a, 163a, $N^+$-type polysilicon films 151a, 155a, 159a and silicon oxide films 148, 150a, 152a, 154a, 156a, 158a, 160a, 162a as shown in FIG. 28.

Figure 29:
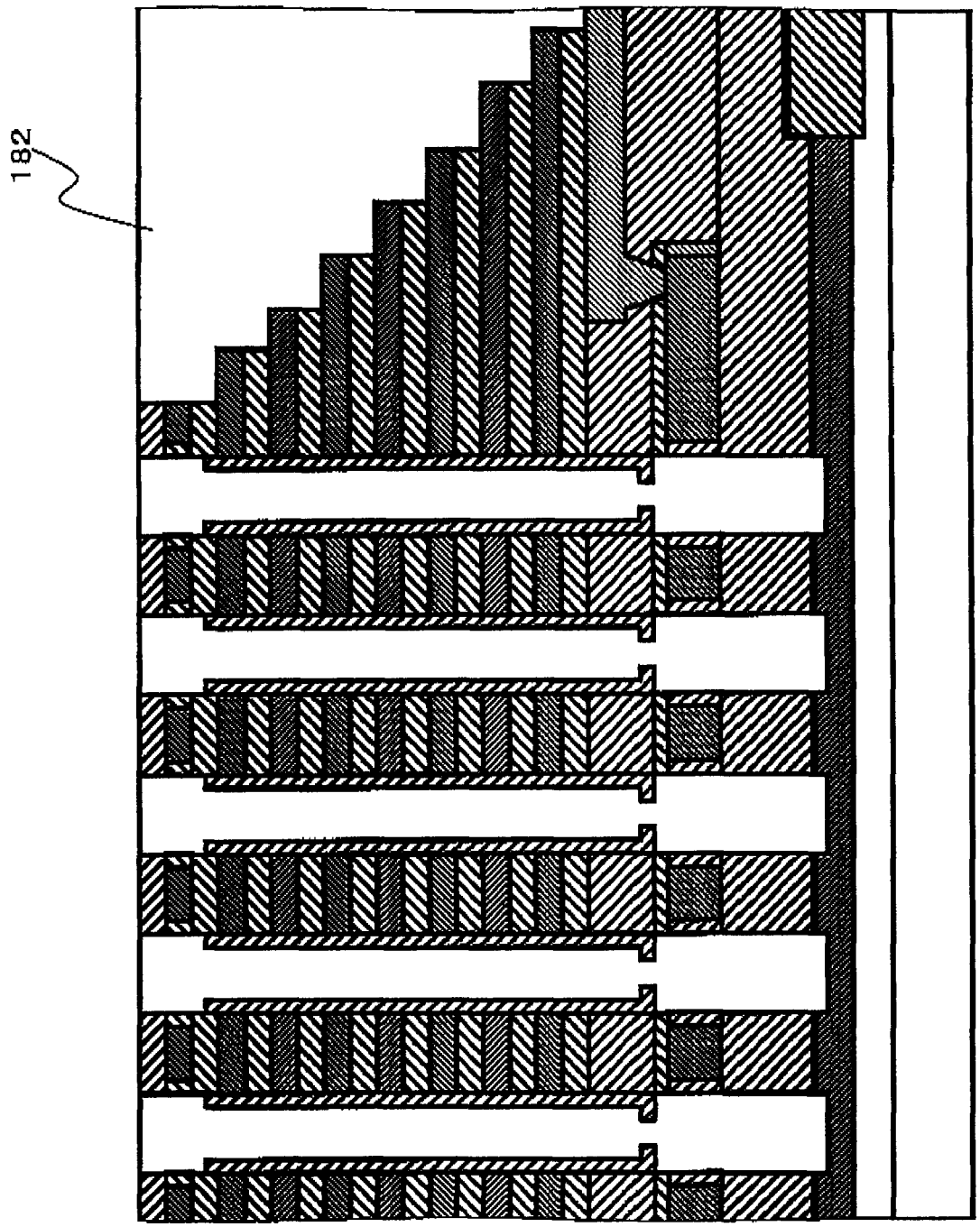
FIG. 29 is a diagram of the process step (29) of manufacturing the nonvolatile semiconductor memory device in the first embodiment.

Next, an interlayer insulator (BSPG) 182 is formed as shown in FIG. 29 and then planarized through a CMP process.

Figure 30:
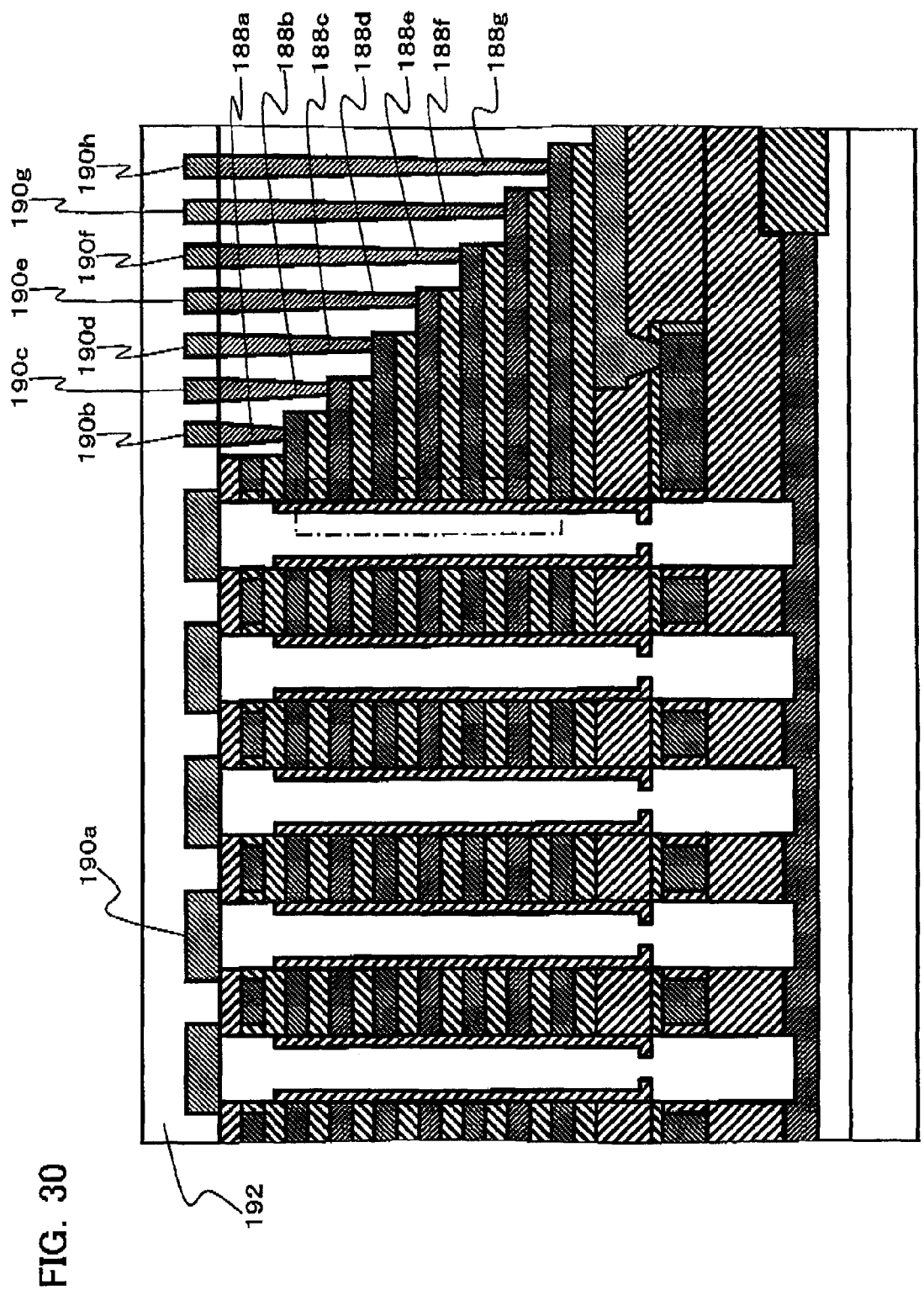
FIG. 30 is a diagram of the process step (20) of manufacturing the nonvolatile semiconductor memory device in the first embodiment.

Subsequently, a photo-etching process is applied to form contact holes, followed by forming a tungsten film, which is subjected to a CMP process to form tungsten plugs 188a, 188b, 188c, 188d, 188e, 188f and 188g as shown in FIG. 30. These tungsten plugs are connected to the $P^+$-type polysilicon films 149a, 153a, 157a, 161a and the $N^+$-type polysilicon films 151a, 155a, 159a. Thereafter, an aluminum (Al) film is formed and subjected to a photo-etching process to form electrodes 190a, 190b, 190c, 190d, 190e, 190f, 190g and 190h. Then, an interlayer insulator (BSPG) 192 is formed and then planarized through a CMP process.

Thereafter, a photo-etching process is applied to form contact holes, followed by forming a tungsten film, which is subjected to a CMP process to form tungsten plugs. Thereafter, an aluminum (Al) film is formed and subjected to a photo-etching process to form electrodes.

Figure 31:
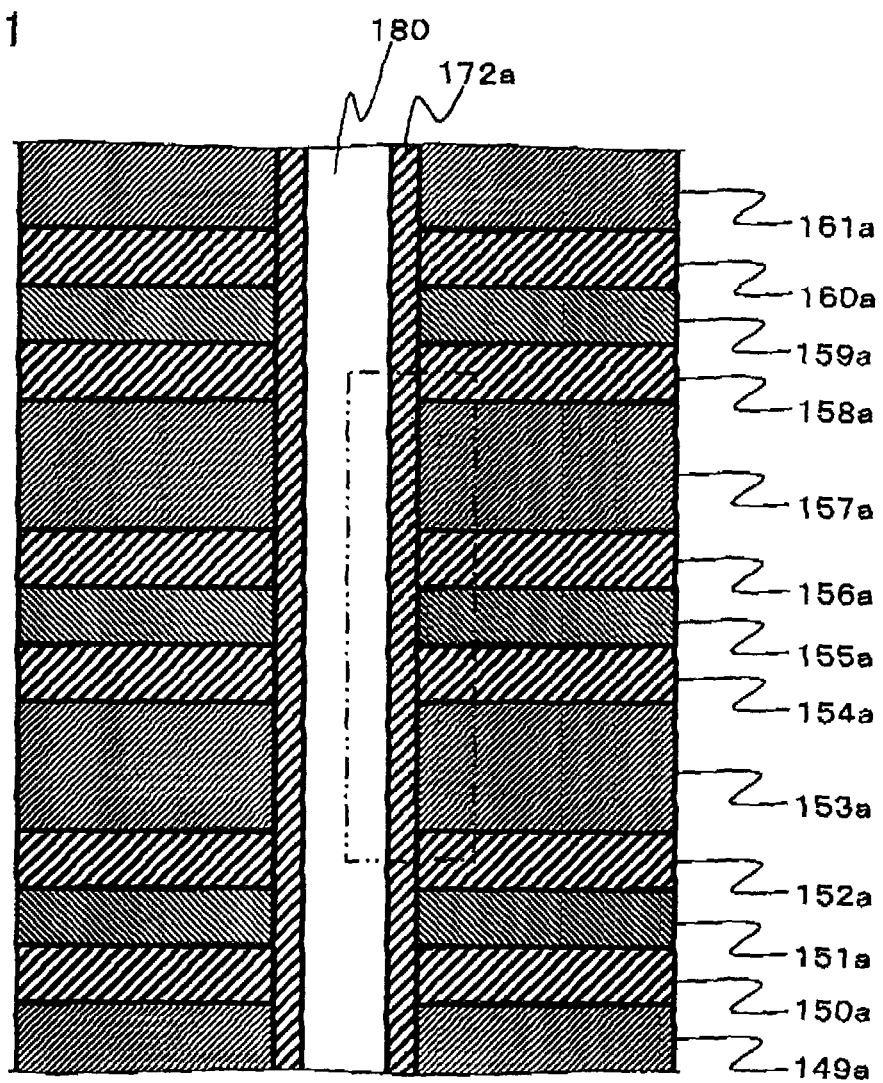
FIG. 31 is a block diagram of the major part of the nonvolatile semiconductor memory device in the first embodiment.
Figure 32:
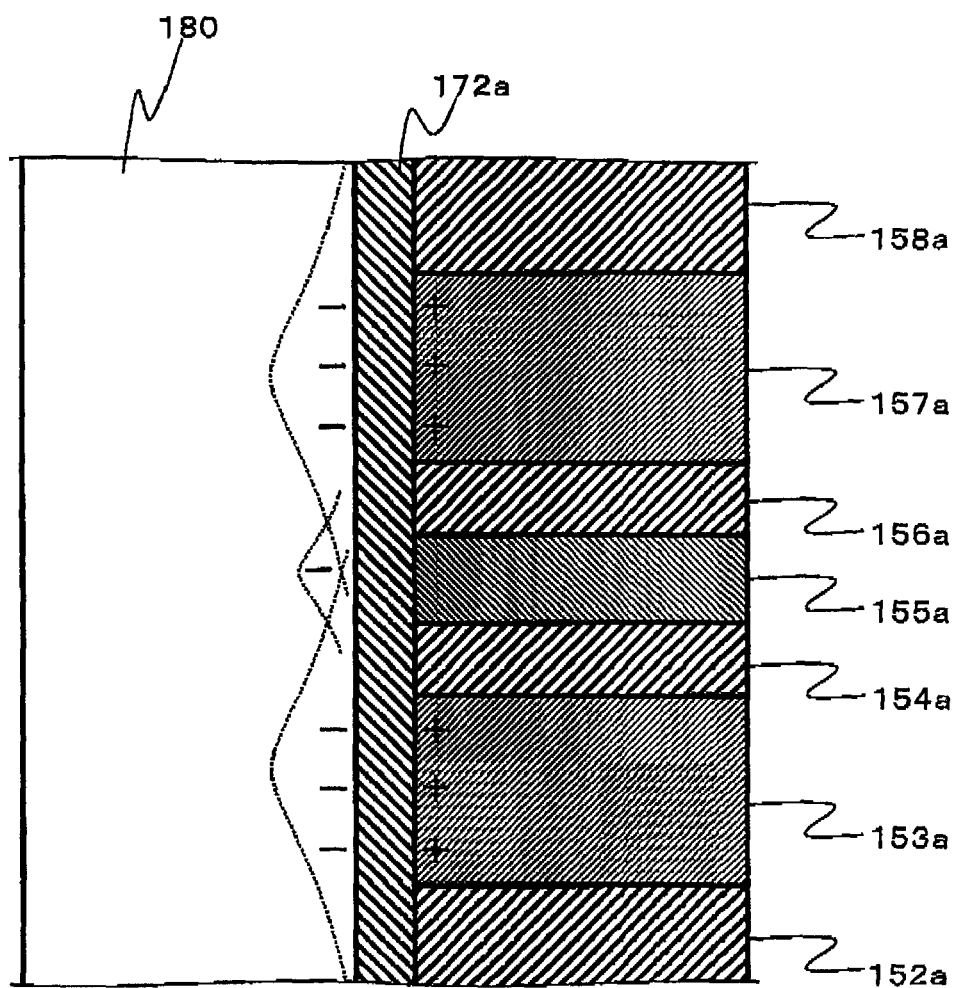
FIG. 32 is an illustrative view of the nonvolatile semiconductor memory device in the first embodiment.

Through the above steps, the nonvolatile semiconductor memory device according to the present embodiment can be produced as shown in FIGS. 31 and 32. FIG. 31 is an enlarged cross-sectional view of one memory string MS, and FIG. 32 is a conceptual view showing operation thereof. As described above, in the present embodiment, formed between the $P^+$-type polysilicon films 149a, 153a, 157a, 161a serving as the word lines WL1-4 are the $N^+$-type polysilicon films 151a, 155a, 159a serving as the interlayer electrodes IL1-3. In the nonvolatile semiconductor memory device according to the present embodiment thus produced, the word lines WL1-4 are plate-shaped and structured stepwise. As the word lines WL1-4 are plate-shaped and structured stepwise, the side ends of the word lines WL1-4 cause steps. The use of the steps allows an identical photo-etching process to form contact holes for connecting the word line drivers with the word lines WL1-4. In the contact holes, the electrodes 188a, 188c, 188e, 188g are formed for connection. Using contact holes simultaneously formed through the photo-etching process, the bit line BL is connected to the sense amp, and the selection gate line SGD to the selection gate line SGD driver.

[Functions]

Functions of the nonvolatile semiconductor memory device according to the present embodiment are described next specifically.

Figure 33:
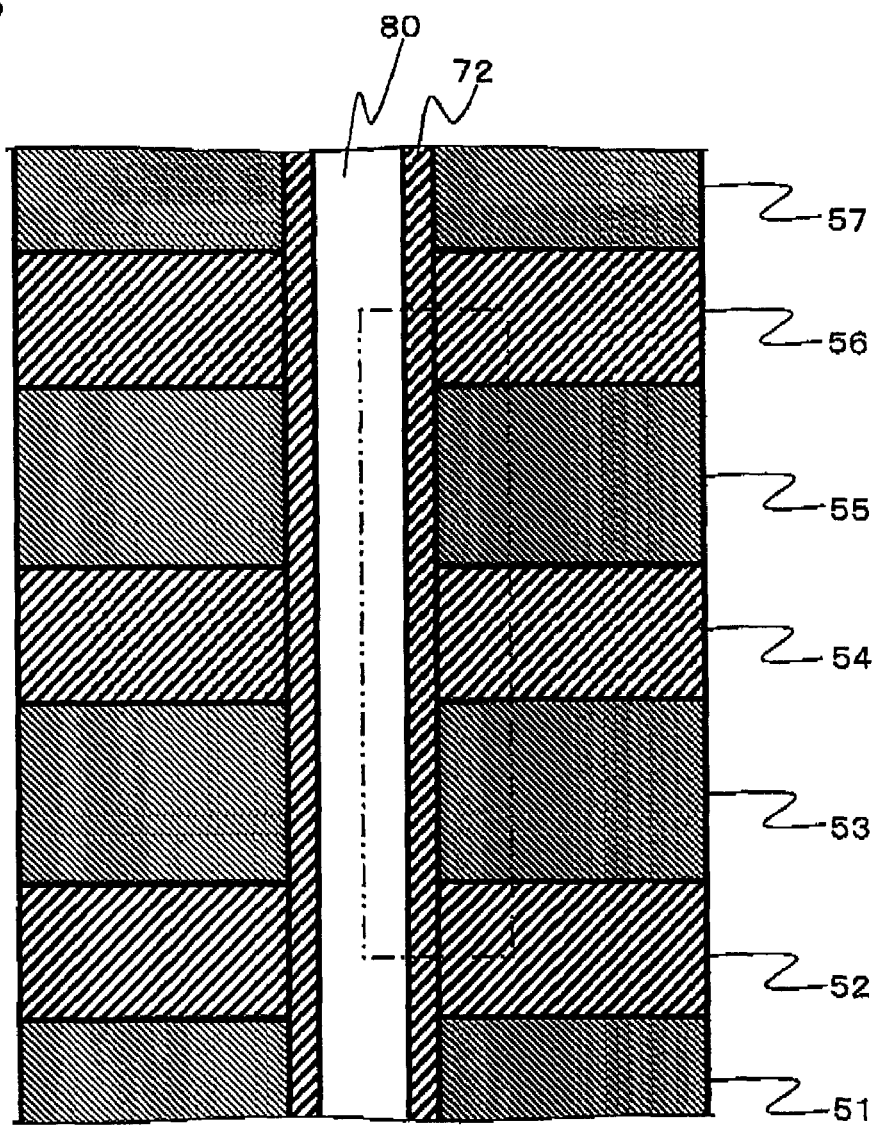
FIG. 33 is a block diagram of the major part of a conventional SGT.

FIG. 33 shows a vertical transistor configured without the interlayer electrodes IL1-3, different from the present embodiment. In this case, surrounding a pillar-shaped amorphous silicon layer 80, an ONO film 72 is formed. Around the circumference, a $P^+$-type polysilicon film 51, a silicon oxide 52, a $P^+$-type polysilicon film 53, a silicon oxide 54, a $P^+$-type polysilicon film 55, a silicon oxide 56, and a $P^+$-type polysilicon film 57 are formed. The $P^+$-type polysilicon films 51, 53, 55, 57 are turned into gate electrodes of vertically formed transistors. This structure makes it possible to reduce the chip area and provide nonvolatile semiconductor memory devices at low costs and high yields.

Figure 34:
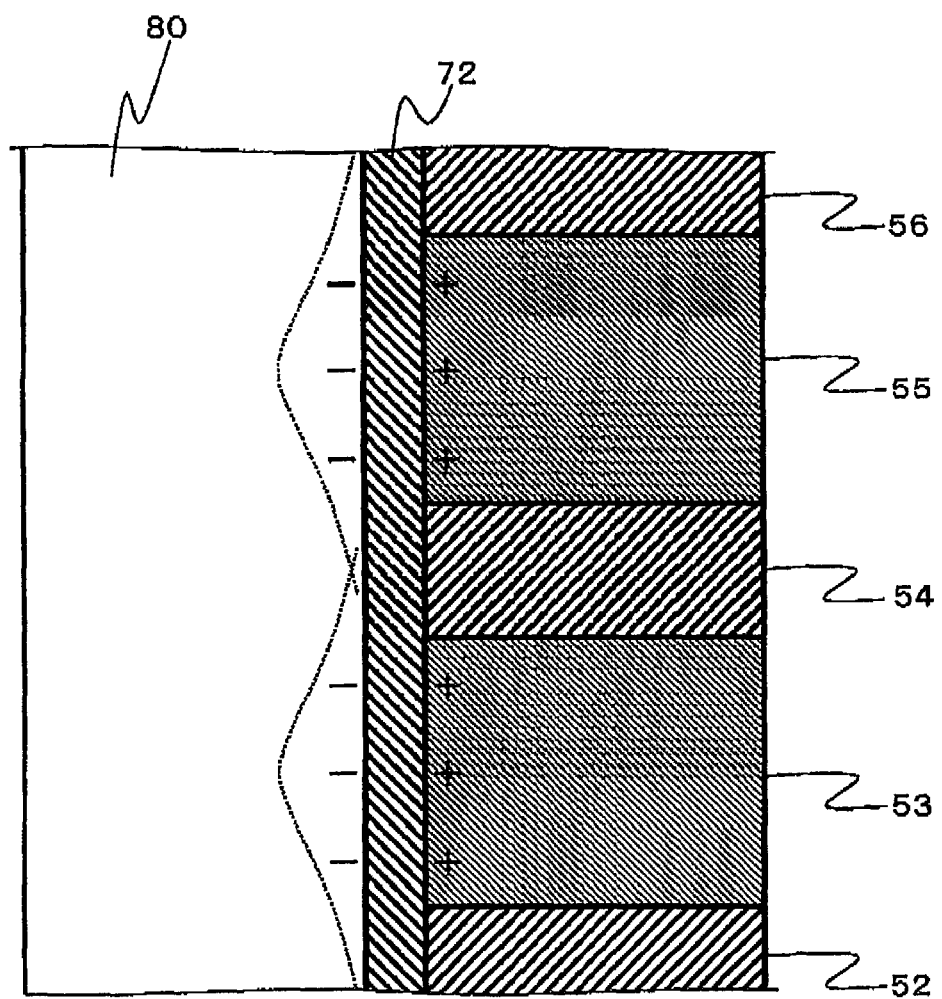
FIG. 34 is an illustrative view of the conventional SGT.

A detailed description is given based on FIG. 34. FIG. 34 is an enlarged view of a region surrounded with the double dotted chain line shown in FIG. 33. In the nonvolatile semiconductor memory device thus configured, the word lines to be turned into the gate electrodes are formed in plates. Therefore, variations in voltage on a selected word line may cause fluctuations of the potential on an adjacent word line through capacitive coupling, resulting in unstable operation. The electric field applied to the $P^+$-type polysilicon film 53, 55 collects charge to form a channel in the amorphous layer 80 in the vicinity of the ONO film 72. In the channel in a region between gate electrodes, that is, a region in the amorphous layer 80 on the opposite side from the silicon oxide 54 with the ONO film 72 interposed, however, channels caused by the upper and lower gate electrodes may overlap insufficiently. Such the case may cause increases and variations in serial resistance of transistors. The channels are formed narrow, unstable and highly resistive.

In contrast, the present embodiment has a configuration as shown in FIG. 31 (configuration as shown in a region surrounded with the dotted chain line in FIG. 30). Specifically, surrounding the pillar-shaped amorphous silicon layer 180, the ONO film 172a is formed. Around the circumference, the $P^+$-type polysilicon film 149a, the silicon oxide 150a, the $N^+$-type polysilicon film 151a, the silicon oxide 152a, the $P^+$-type polysilicon film 153a, the silicon oxide 154a, the $N^+$-type polysilicon film 155a, the silicon oxide 156a, the $P^+$-type polysilicon film 157a, the silicon oxide 158a, the $N^+$-type polysilicon film 159a, the silicon oxide 160a, and the $P^+$-type polysilicon film 161a are formed in a stacked manner. The $P^+$-type polysilicon films 149a, 153a, 157a, 161a are turned into the gate electrodes of the vertically formed transistors, and the $N^+$-type polysilicon film 151a, 155a, 159a are turned into the interlayer electrodes. FIG. 32 is an enlarged view of the region shown in FIG. 31 surrounded with the double dotted chain line.

Such the configuration enables the interlayer electrode to block the influence from the fluctuation of the potential on the gate electrode if the potential on the interlayer electrode is fixed even though the potential on the gate electrode associated with the selected word line fluctuates. Thus, the potential on the gate electrode associated with an adjacent word line can be prevented from fluctuating.

The $N^+$-type polysilicon film 155a serving as the interlayer electrode has a smaller work function, which results in a charge-caused state to form a channel in the vicinity of the ONO film 172a in the amorphous silicon film 180. As a result, when an electric field is applied to the $P^+$-type polysilicon films 153a, 157a serving as the gate electrodes, the formed channels surely connect to realize a lowered and stabilized series resistance of the transistors in the ON state. For the above reason, in the present embodiment, the $N^+$-type polysilicon film 151a, 155a, 159a are formed as the interlayer electrodes.

The applied voltage can be adjusted to use any interlayer electrode without distinction of the N-type and the P-type. The use of a material having a smaller work function than the material of the word line makes it possible to lower the voltage applied to the interlayer electrode. In further consideration of the processability of hole processing and the like, the $N^+$-type polysilicon film is most preferable for use in formation of the interlayer electrode. In consideration of programming with injection of not electrons but holes as the carrier, the magnitudes of the work function as well as the N-type and the P-type become quite opposite in relation. Namely, in injection of holes, the word lines are composed of $N^+$-type polysilicon while the interlayer electrodes are composed of a conductive material having a larger work function than the word lines, preferably $P^+$-type polysilicon, for example.

Thus, if the memory cell comprises an N-type MOS transistor, the interlayer electrode uses a material having a smaller work function than the material of the word line. In contrast, if the memory cell comprises a P-type MOS transistor, the interlayer electrode uses a material having a larger work function than the material of the word line.

Second Embodiment

A second embodiment is provided in which the $N^+$-type polysilicon film serving as the interlayer electrode in the first embodiment is replaced with a metal film.

Figure 35:
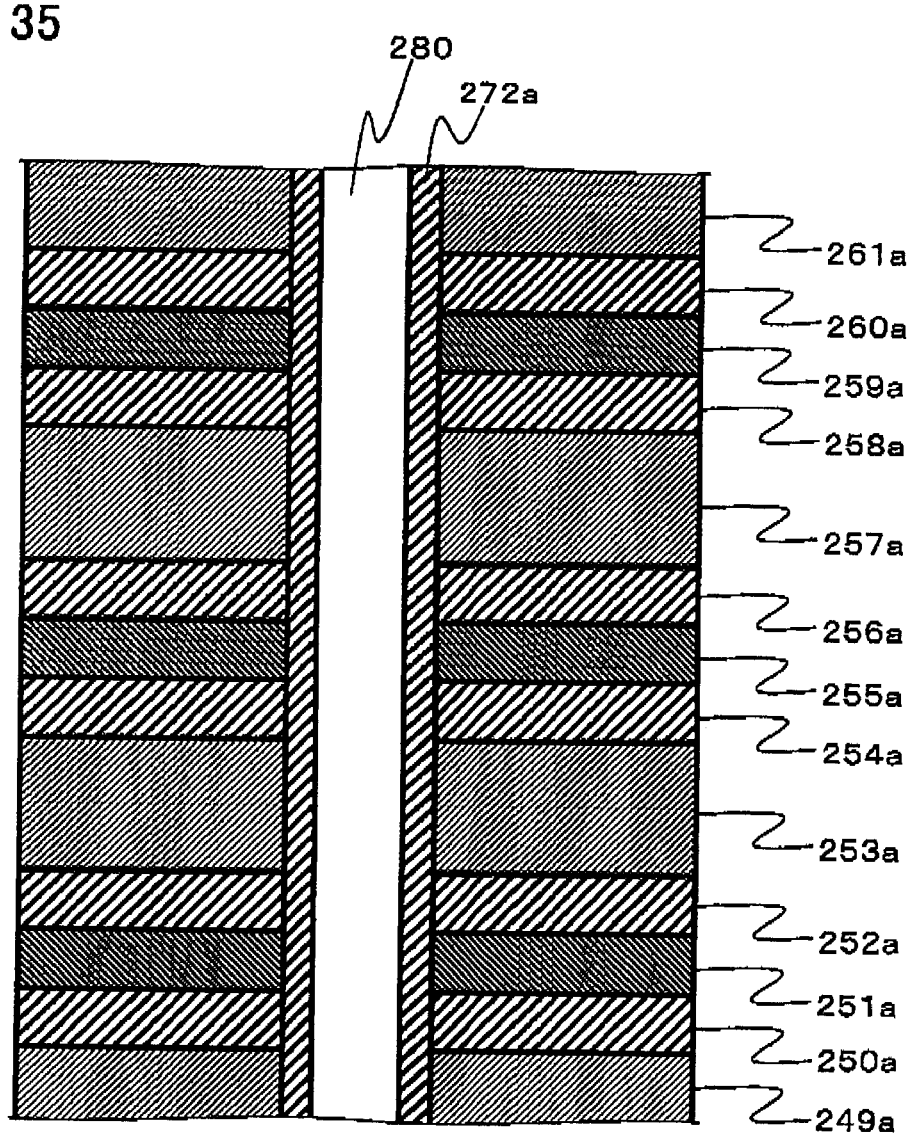
FIG. 35 is a block diagram of the major part of a nonvolatile semiconductor memory device in a second embodiment.

FIG. 35 is an enlarged view of a region between gate electrodes in the present embodiment. Surrounding a pillar-shaped amorphous silicon layer 280, an ONO film 272a is formed. Around the circumference, a $P^+$-type polysilicon film 249a, a silicon oxide 250a, a metal film 251a, a silicon oxide 252a, a $P^+$-type polysilicon film 253a, a silicon oxide 254a, a metal film 255a, a silicon oxide 256a, a $P^+$-type polysilicon film 257a, a silicon oxide 258a, a metal film 259a, a silicon oxide 260a, and a $P^+$-type polysilicon film 261a are formed in a stacked manner.

Thus, the gate electrodes of the vertically formed transistors composed of the $P^+$-type polysilicon films 149a, 153a, 157a, 161a are formed, and the interlayer electrodes composed of the $N^+$-type polysilicon films 251a, 255a, 259a are formed.

The present invention is not limited to the above embodiments but rather can be embodied with varied elements without departing from the scope and spirit in the stages of execution. The elements disclosed in the above embodiments can be appropriately combined to form various inventions. For example, some of all the elements shown in the embodiments may be deleted. Further, the elements over different embodiments may be added and combined appropriately.

What is claimed is:

1. A nonvolatile semiconductor memory device comprising a plurality of memory strings each including a plurality of electrically programmable memory cells connected in series, said memory string including a semiconductor pillar, an insulator formed around the circumference of said semiconductor pillar, first through nth electrodes to be turned into gate electrodes (n denotes a natural number equal to 2 or more) formed around the circumference via said insulator, and interlayer electrodes formed in regions between said first through nth electrodes around the circumference via said insulator, wherein said interlayer electrodes are formed of a material having a different work function from the material of said first through nth electrodes.

2. The nonvolatile semiconductor memory device according to claim 1, wherein said first through nth electrodes in said memory string are formed of first through nth first conductor layers expanding in two dimensions,
wherein said interlayer electrodes are formed of respective second conductor layers expanding in two dimensions,
wherein said first conductor layers form said first through nth electrodes in a different one of said memory strings.

3. The nonvolatile semiconductor memory device according to claim 1, wherein said plurality of memory strings are arranged in matrix within a plane normal to said semiconductor pillar.

4. The nonvolatile semiconductor memory device according to claim 1, wherein said first through nth electrodes are composed of a semiconductor material of the first conduction type, wherein said interlayer electrodes are composed of a semiconductor material of the second conduction type.

5. The nonvolatile semiconductor memory device according to claim 1, wherein said interlayer electrodes are composed of a metal film.

6. The nonvolatile semiconductor memory device according to claim 1, wherein said insulator includes a charge storage layer for charge storage.

7. The nonvolatile semiconductor memory device according to claim 1, wherein said memory string includes a first selection transistor connected between said memory cell and a bit line, and a second selection transistor connected between said memory cell and a source line,
wherein said first selection transistor is connected to a first selection gate line shaped in a stripe extending in a first direction and isolated from others in a second direction,
wherein said second selection transistor is connected to a second selection gate line formed in a plate expanding in two dimensions.

8. The nonvolatile semiconductor memory device according to claim 1, wherein said interlayer electrodes are kept at a fixed potential while the potentials on said first through nth electrodes are switched.

9. The nonvolatile semiconductor memory device according to claim 1, wherein said source line comprises a diffused region formed in a semiconductor substrate.

10. A nonvolatile semiconductor memory device comprising a plurality of memory strings each including a plurality of electrically programmable memory cells connected in series, said memory string including a semiconductor pillar extending in a direction normal to a semiconductor substrate, an insulator formed around the circumference of said semiconductor pillar, first through nth electrodes to be turned into gate electrodes (n denotes a natural number equal to 2 or more) around the circumference via said insulator, and interlayer electrodes formed in regions between said first through nth electrodes around the circumference via said insulator, wherein said first through nth electrodes comprise electrodes commonly connected to a plurality of such semiconductor pillars, wherein said interlayer electrodes are formed of a material having a different work function from the material of said first through nth electrodes.

11. The nonvolatile semiconductor memory device according to claim 10, wherein said first through nth electrodes in said memory string are formed of first through nth first conductor layers expanding in two dimensions,
wherein said interlayer electrodes are formed of respective second conductor layers expanding in two dimensions,
wherein said first conductor layers form said first through nth electrodes in a different one of said memory strings.

12. The nonvolatile semiconductor memory device according to claim 10, wherein said plurality of memory strings are arranged in matrix within a plane normal to said semiconductor pillar.

13. The nonvolatile semiconductor memory device according to claim 10, wherein said first through nth electrodes are composed of a semiconductor material of the first conduction type, wherein said interlayer electrodes are composed of a semiconductor material of the second conduction type.

14. The nonvolatile semiconductor memory device according to claim 10, wherein said interlayer electrodes are composed of a metal film.

15. The nonvolatile semiconductor memory device according to claim 10, wherein said insulator includes a charge storage layer for charge storage.

16. The nonvolatile semiconductor memory device according to claim 10, wherein said memory string includes a first selection transistor connected between said memory cell and a bit line, and a second selection transistor connected between said memory cell and a source line,
wherein said first selection transistor is connected to a first selection gate line shaped in a stripe extending in a first direction and isolated from others in a second direction,
wherein said second selection transistor is connected to a second selection gate line formed in a plate expanding in two dimensions.

17. The nonvolatile semiconductor memory device according to claim 10, wherein said interlayer electrodes are kept at a fixed potential while the potentials on said first through nth electrodes are switched.

18. The nonvolatile semiconductor memory device according to claim 10, wherein said source line comprises a diffused region formed in a semiconductor substrate.

* * * * *